US012628449B2

(12) United States Patent
Wang et al.

(10) Patent No.: US 12,628,449 B2
(45) Date of Patent: May 12, 2026

(54) INTEGRATED PHOTOSENSITIVE MODULE, PHOTOSENSITIVE ASSEMBLY, CAMERA MODULE AND PREPARATION METHOD THEREFOR

(71) Applicant: Ningbo Sunny Opotech Co., Ltd., Ningbo (CN)

(72) Inventors: Mingzhu Wang, Zhejiang (CN); Takehiko Tanaka, Nara (JP); Lifeng Yao, Zhejiang (CN); Zhen Huang, Zhejiang (CN); Nan Guo, Zhejiang (CN); Xiaodi Liu, Zhejiang (CN); Zhenyu Chen, Zhejiang (CN)

(73) Assignee: NINGBO SUNNY OPOTECH CO., LTD., Ningbo (CN)

( * ) Notice: Subject to any disclaimer, the term of this patent is extended or adjusted under 35 U.S.C. 154(b) by 501 days.

(21) Appl. No.: 18/118,264

(22) Filed: Mar. 7, 2023

(65) Prior Publication Data
US 2023/0207588 A1 Jun. 29, 2023

Related U.S. Application Data

(63) Continuation of application No. 16/969,293, filed as application No. PCT/CN2019/074905 on Feb. 13, 2019, now abandoned.

(30) Foreign Application Priority Data

Feb. 13, 2018 (CN) ......................... 201810150993.9

(51) Int. Cl.
*H10F 39/00* (2025.01)
(52) U.S. Cl.
CPC ......... *H10F 39/804* (2025.01); *H10F 39/024* (2025.01); *H10F 39/026* (2025.01); *H10F 39/806* (2025.01)

(58) Field of Classification Search
CPC .... H10F 39/804; H10F 39/806; H10F 39/026; H10F 39/024
See application file for complete search history.

(56) References Cited

U.S. PATENT DOCUMENTS 7,791,014 B2    9/2010   Camargo
9,343,597 B2    5/2016   Suzuki
(Continued)

FOREIGN PATENT DOCUMENTS

CN     101138094     3/2008
CN     102369101     3/2012
(Continued)

OTHER PUBLICATIONS

International Search Report issued May 13, 2019 in International (PCT) Application No. PCT/CN2019/074905.
(Continued)

*Primary Examiner* — Mounir S Amer
*Assistant Examiner* — Alexander Belousov
(74) *Attorney, Agent, or Firm* — Wenderoth, Lind & Ponack, L.L.P.

(57) ABSTRACT

Disclosed is a photosensitive module (21), adapted to a camera module, comprising a photosensitive element (211), a light transmitting element (212) and an isolation adhesive layer (213), wherein the photosensitive element has a photosensitive region and a non-photosensitive region, the light transmitting element is arranged in a photosensitive path of the photosensitive element, and wherein the isolation adhesive layer is arranged in the non-photosensitive region and supports the light transmitting element, and the isolation adhesive layer is formed by means of photolithography.

6 Claims, 14 Drawing Sheets

(56)                References Cited

U.S. PATENT DOCUMENTS

| | | | |
|---|---|---|---|
| 9,520,428 | B2 | 12/2016 | Fujimori |
| 9,735,115 | B2 | 8/2017 | Suzuki |
| 9,781,323 | B1 | 10/2017 | Wang |
| 10,116,843 | B2 | 10/2018 | Zhang |
| 10,230,876 | B2 | 3/2019 | Wang |
| 10,356,299 | B2 | 7/2019 | Wang |
| 10,440,247 | B2 | 10/2019 | Wang |
| 10,658,301 | B2 | 5/2020 | Suzuki |
| 10,701,255 | B2 | 6/2020 | Wang |
| 10,735,631 | B2 | 8/2020 | Zhang |
| 10,750,074 | B2 | 8/2020 | Wang |
| 10,784,205 | B2 | 9/2020 | Hu |
| 10,958,816 | B2 | 3/2021 | Wang |
| 2006/0071347 | A1 | 4/2006 | Dotta |
| 2008/0157312 | A1 | 7/2008 | Yang |
| 2008/0179503 | A1 | 7/2008 | Camargo et al. |
| 2009/0079863 | A1 | 3/2009 | Aoki |
| 2009/0256222 | A1 | 10/2009 | Hsu |
| 2009/0283311 | A1 | 11/2009 | Ida |
| 2010/0328525 | A1 | 12/2010 | Lee |
| 2011/0147872 | A1 | 6/2011 | Inoue |
| 2012/0012989 | A1 | 1/2012 | Sato |
| 2012/0032284 | A1 | 2/2012 | Dejima |
| 2012/0056292 | A1 | 3/2012 | Suzuki |
| 2012/0286400 | A1 | 11/2012 | Camacho |
| 2013/0038764 | A1 | 2/2013 | Takachi |
| 2013/0194464 | A1 | 8/2013 | Suzuki |
| 2013/0320471 | A1* | 12/2013 | Luan ..................... H10F 39/806 |
| | | | 257/E31.127 |
| 2014/0028905 | A1 | 1/2014 | Kim |
| 2014/0043496 | A1 | 2/2014 | Azuma |
| 2014/0043519 | A1 | 2/2014 | Azuma |
| 2014/0043525 | A1 | 2/2014 | Azuma |
| 2014/0253794 | A1 | 9/2014 | Miyazaki |
| 2016/0043122 | A1 | 2/2016 | Fujimori |
| 2016/0191767 | A1 | 6/2016 | Otani |
| 2016/0212852 | A1 | 7/2016 | Hu et al. |
| 2016/0351618 | A1 | 12/2016 | Vittu |
| 2017/0280027 | A1 | 9/2017 | Wang |
| 2018/0048798 | A1 | 2/2018 | Wang |
| 2018/0090530 | A1 | 3/2018 | Jeong |
| 2018/0190558 | A1* | 7/2018 | Hsu ........................ H01L 24/20 |
| 2019/0387147 | A1 | 12/2019 | Wang |
| 2020/0403017 | A1 | 12/2020 | Wang |
| 2021/0296389 | A1 | 9/2021 | Wang |

FOREIGN PATENT DOCUMENTS

| | | |
|---|---|---|
| CN | 105681640 | 6/2016 |
| CN | 105845635 | 8/2016 |
| CN | 106024819 | 10/2016 |
| CN | 106449546 | 2/2017 |
| CN | 206922907 | 1/2018 |
| EP | 1 858 086 | 11/2007 |
| EP | 2400542 | 12/2011 |
| EP | 2 415 592 | 2/2012 |

OTHER PUBLICATIONS

Partial Supplementary European Search Report issued May 6, 2021 in corresponding European Patent Application No. 19755047.8.
Extended European Search Report issued Aug. 6, 2021 in corresponding European Patent Application No. 19755047.8.

* cited by examiner

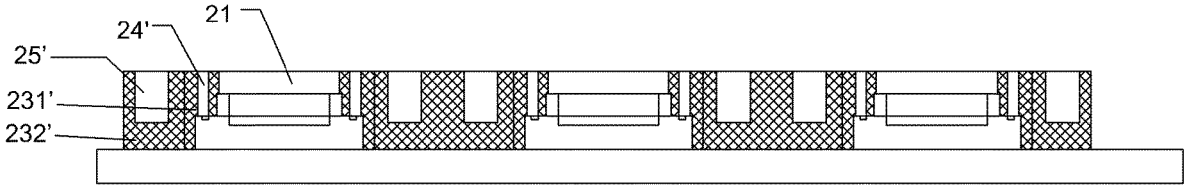
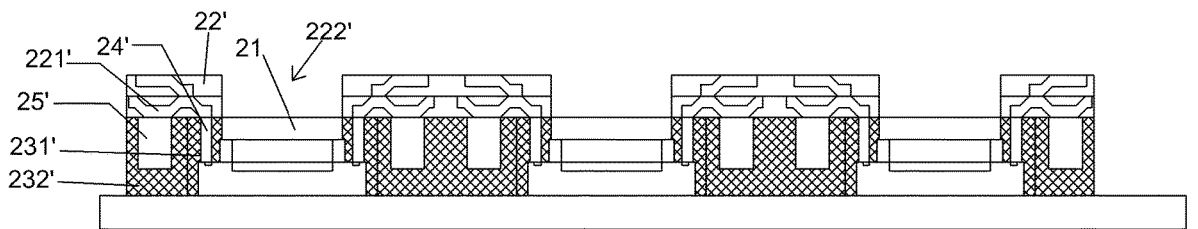
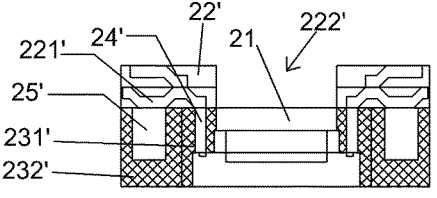
Figure 14

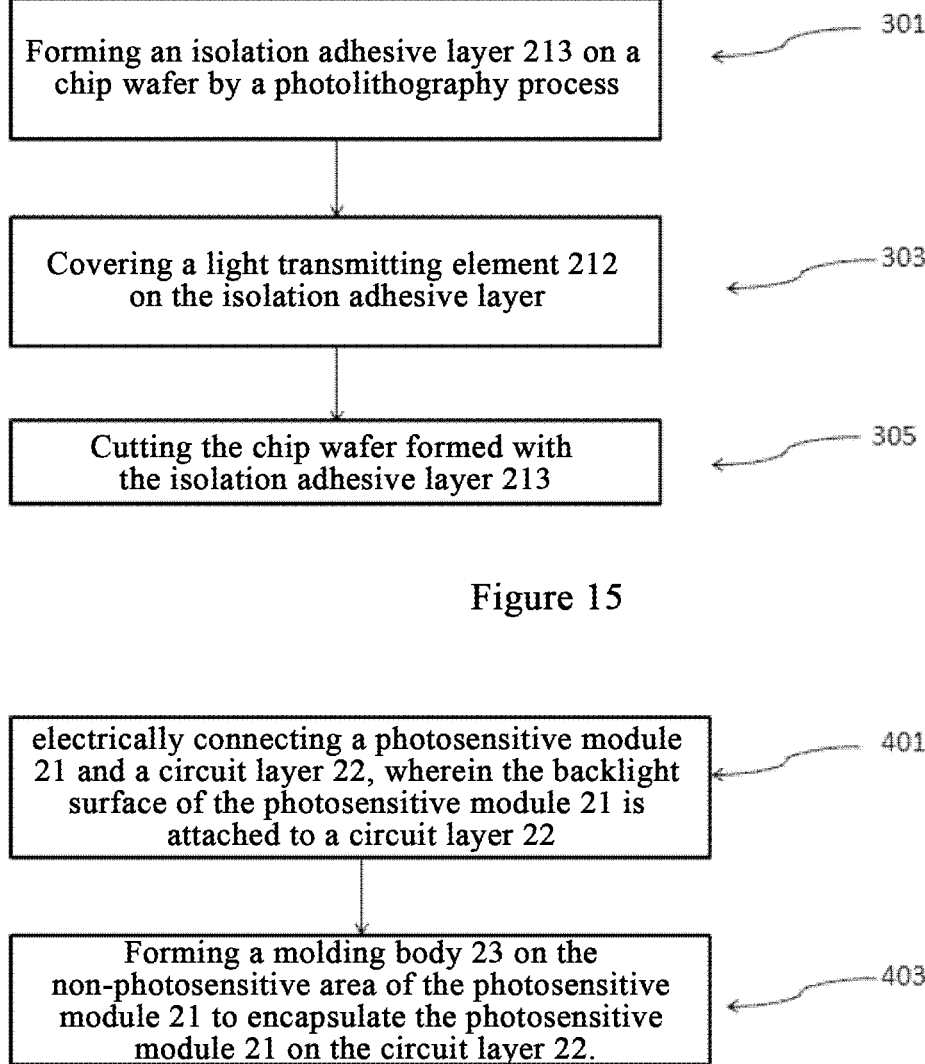

Forming an isolation adhesive layer 213 on a
chip wafer by a photolithography process

301

Covering a light transmitting element 212
on the isolation adhesive layer

303

Cutting the chip wafer formed with
the isolation adhesive layer 213

305

Figure 15 electrically connecting a photosensitive module
21 and a circuit layer 22, wherein the backlight
surface of the photosensitive module 21 is
attached to a circuit layer 22

401

Forming a molding body 23 on the
non-photosensitive area of the photosensitive
module 21 to encapsulate the photosensitive
module 21 on the circuit layer 22.

INTEGRATED PHOTOSENSITIVE MODULE, PHOTOSENSITIVE ASSEMBLY, CAMERA MODULE AND PREPARATION METHOD THEREFOR

FIELD OF THE INVENTION

The invention relates to field of a camera module, in particular to a photosensitive module in which a light transmitting element is directly provided on a photosensitive element, a photosensitive assembly including the same, a camera module, and a preparation method thereof.

BACKGROUND OF THE INVENTION

In recent years, with the popularization and development of smart devices, they have become increasingly thin and light. Correspondingly, camera modules is required to be adapted to be developed, and become more and more multi-functional integration, light and thin, and miniaturization, so that the volume required for the camera module to be assembled in smart electronic device can be reduced accordingly, and meet the imaging requirements of the camera module. Therefore, camera module manufacturers continue to devote themselves to designing and manufacturing camera modules that meet these requirements.

In the prior art, as an essential element, the filter is usually mounted on the lens holder first, and then assembled with the photosensitive element on the circuit board to maintain a certain distance between the light transmitting element and the photosensitive element to prevent it from squeezing the microlens structure on the surface of the chip of the photosensitive element, also prevent dirt on the light transmitting element from being imaged on the photosensitive element due to the filter being too close to the photosensitive element, which affects the imaging quality of the camera module. However, at present, the lens holder is usually formed by an injection molding process. Due to the limitation of the injection molding process, its height is often at least 200 um or more, which limits the height and size of the camera module to be further reduced, which is contrary to market demand.

Molding and packaging process is a packaging technology newly developed on the basis of traditional COB (Chip on Board) packaging process. A circuit board assembly prepared by a molding and packaging process has a structure in which a molding portion is packaged on a circuit board by a molding and packaging manner to covering at least a part of the circuit board integrally and electronic components assembled on the circuit board, such as photosensitive elements, passive electronic components, etc., and a filter is attached to and mounted on the top side of the molding portion.

For the camera module, it includes many relatively fragile but highly sensitive electronic components, especially photosensitive elements. During the molding process, on one hand, it is necessary to provide a sealed environment for the photosensitive region of the photosensitive element to prevent the molding material with fluidity from penetrating into the photosensitive element to make it invalid; on the other hand, it should be as much as possible to avoid direct contact between the photosensitive element and the molding surface of the molding die, so as to prevent the photosensitive element from being damaged due to withstanding excessive pressure. Therefore, in the existing molding process, it is usually selected to provide a isolation adhesive layer in the corresponding region of the photosensitive element to solve the above concerns. Specifically, the isolation adhesive layer is circumferentially provided outside the photosensitive region of the photosensitive element, so as to form a sealed environment for the photosensitive element through the cooperation between the isolation adhesive layer and the molding surface. At the same time, the protruding isolation adhesive layer can effectively prevent direct mechanical contact between the photosensitive element and the molding surface of the molding die to protect the photosensitive element.

However, it is well known that the imaging performance of the camera module depends on the effective photosensitive area of the photosensitive element, that is, the area of the photosensitive region. Therefore, in order to increase the pixel requirements of the camera module, the area of the photosensitive region of the photosensitive element must be enlarged. At the same time, the camera module also requires a trend toward miniaturization, that is, the overall size of the photosensitive element needs to be reduced. In order to meet the two technical requirements at the same time, the range of the non-photosensitive region of the photosensitive element will inevitably be continuously reduced, thereby causing a lot of troubles for forming the isolation adhesive layer.

As the area of the non-photosensitive region shrinks, the possibility of the glue erroneously staining the photosensitive element during the formation of the isolation adhesive layer is greatly increased. At the same time, due to the reduction of the area where the isolation adhesive layer is laid, the shape and size requirements of the isolation adhesive layer are becoming more and more stringent, especially the thickness requirement of the isolation adhesive layer, which will inevitably increase the performance requirements of the equipment forming the isolation adhesive layer and the glue material forming the isolation adhesive layer, resulting in an increase in process cost.

In addition, due to the performance defects of the existing dispensing equipment and the limitations of the dispensing material, the flatness of the isolation adhesive layer is difficult to guarantee. Usually, the top surface of the isolation adhesive layer is a curved surface. Therefore, the isolation adhesive layer and the molding surfaces of the mold die are adhered together to form a sealed environment, the tightness between the flat molding surface and the isolation adhesive layer with a curved surface is difficult to ensure, which may easily cause molding process errors.

In addition, it is also limited by the dispensing material. When the isolation adhesive layer is pressed by the molding surface of the molding die, it is prone to secondary deformation or even collapse, so that the glue flows to the photosensitive region of the photosensitive element, causing the photosensitive element to be contaminated. It can be understood that, during the secondary deformation or collapse of the isolation adhesive layer, the width of the isolation adhesive layer increases and the height of it decreases. Generally, the ratio of height to width of the isolation adhesive layer after compression is less than that before compression, thus when the isolation adhesive layer is squashed, the widened isolation adhesive layer extends in the non-photosensitive region of the photosensitive element that has been continuously reduced, and easily touches the photosensitive region of the photosensitive element to cause the photosensitive element to be contaminated.

SUMMARY OF THE INVENTION

An object of the present invention is to provide an integrated photosensitive module, a photosensitive assembly, a camera module and a preparation method, wherein the integrated photosensitive module uses a photolithography technology to form an isolation adhesive layer to solve problem of the existing dispensing technology forming the isolation adhesive layer.

Another object of the present invention is to provide an integrated photosensitive module, a photosensitive assembly, a camera module and a preparation method, wherein compared to existing technology, the isolation adhesive layer formed by the photolithography technology is thinner, so that an overall thickness and a size of the photosensitive assembly is reduced.

Another object of the present invention is to provide an integrated photosensitive module, a photosensitive assembly, a camera module and a preparation method, wherein compared to existing technology, the isolation adhesive layer formed by the photolithography technology has a flatter top surface and a bottom surface, which allows a light transmitting element to be flatly supported, to facilitate formation of a closed space.

Another object of the present invention is to provide an integrated photosensitive module, a photosensitive assembly, a camera module and a preparation method, wherein the isolation adhesive layer has a flatter top and bottom surfaces, which can ensure that the parallelism between the light transmitting element and photosensitive elements.

Another object of the present invention is to provide an integrated photosensitive module, a photosensitive assembly, a camera module and a preparation method, wherein the isolation adhesive layer is not easily affected by external environment, can maintain its geometric shape, and avoid compression deformation.

Another object of the present invention is to provide an integrated photosensitive module, a photosensitive assembly, a camera module and a preparation method, wherein a formation process of the isolation adhesive layer formed by the photolithography technology is easier to be controlled, reducing possibility of contaminating a photosensitive region of the photosensitive element.

Another object of the present invention is to provide an integrated photosensitive module, a photosensitive assembly, a camera module and a preparation method, wherein the isolation adhesive layer is a closed structure, forming an enclosed space between the light transmitting element and the photosensitive element to protect the photosensitive region.

Another object of the present invention is to provide an integrated photosensitive module, a photosensitive assembly, a camera module and a preparation method, wherein the isolation adhesive layer is a closed structure, which can prevent glue from overflowing to the photosensitive region.

Another object of the present invention is to provide an integrated photosensitive module, a photosensitive assembly, a camera module and a preparation method, wherein the isolation adhesive layer has a preset distance from an edge of the photosensitive region, so as to prevent the glue from overflowing to the photosensitive region.

Another object of the present invention is to provide an integrated photosensitive module, a photosensitive assembly, a camera module and a preparation method, wherein compared to dispensing technology, the isolation adhesive layer formed by the photolithography technology has higher formation precision and narrower limit width, which is suitable for a present trend that the non-photosensitive region is compressed.

Another object of the present invention is to provide an integrated photosensitive module, a photosensitive assembly, a camera module and a preparation method, wherein the isolation adhesive layer formed by the photolithography technology may be that the light transmitting element and the photosensitive element maintain a certain distance to prevent the light transmitting element from polluting the photosensitive element or affecting the image information received by the photosensitive element.

Another object of the present invention is to provide an integrated photosensitive module, a photosensitive assembly, a camera module and a preparation method, wherein the integrated photosensitive module and photosensitive assembly can be applied to a fixed focus module or a dynamic focus module.

In order to achieve at least one of the above objects, according to an aspect of the present invention, the present invention provides a photosensitive module suitable for a camera module including:

a photosensitive element, wherein the photosensitive element has a photosensitive region and a non-photosensitive region;

a light transmitting element, wherein the light transmitting element is provided on the photosensitive path of the photosensitive element; and an isolation adhesive layer, wherein the isolation adhesive layer is provided in the non-photosensitive region and supports the light transmitting element, wherein the isolation adhesive layer is formed using photolithography technology.

According to an embodiment of the present invention, the isolation adhesive layer closely surrounds the photosensitive region, forming an enclosed space with the light transmitting element and the photosensitive element.

According to an embodiment of the present invention, the non-photosensitive region has an electrical connection region, and the isolation adhesive layer is provided on the non-photosensitive region in a manner to be separated from the electrical connection region.

According to an embodiment of the present invention, the isolation adhesive layer has an inner side surface, wherein the inner side surface is spaced apart from an outer edge of the photosensitive region by a preset distance to form an overflow glue space for accommodating overflow glue.

According to an embodiment of the present invention, the isolation adhesive layer has an inner side surface, wherein the inner side surface is perpendicular to the photosensitive region.

According to an embodiment of the present invention, the photosensitive module further includes a filter layer, wherein the filter layer is provided on an exposed side of the light transmitting element.

According to another aspect of the present invention, the present invention further provides a photosensitive assembly suitable for a camera module, including:

a photosensitive module, wherein the photosensitive module includes a photosensitive element, an isolation adhesive layer and a light transmitting element, wherein the photosensitive element has a photosensitive region and a non-photosensitive region, the isolation adhesive layer is provided on the non-photosensitive region, and supports the light transmitting element to be corresponding to the photosensitive region, wherein the isolation adhesive layer is formed by using photolithography technology;

a circuit layer, wherein the circuit layer is electrically connected to the photosensitive element; and a molding body, wherein the molding body encapsulates the photosensitive module and the circuit layer, wherein the exposed side of the light transmitting element is exposed to the outside for light to enter.

According to an embodiment of the present invention, the circuit layer is provided on a bottom side of the photosensitive module, and the photosensitive element is electrically connected and attached to the circuit layer, wherein the molding body is molded on the circuit layer, and has a light passing hole corresponding to the photosensitive region.

According to an embodiment of the present invention, the light transmitting element is provided in the light passing hole, the molding body is wrapped around the peripheral side surface of the light transmitting element, and the exposed side of the light transmitting element is exposed with respect to the top surface of the molding body.

According to an embodiment of the present invention, the peripheral side surface of the light transmitting element is roughened.

According to an embodiment of the present invention, the peripheral side surface of the light transmitting element is inclined, and the light passing hole formed by the molding body wrapping around the peripheral side surface of the light transmitting element has a bottom-up increased shape.

According to an embodiment of the present invention, the light transmitting element is located at bottom part of the light passing hole, and the light transmitting element and the molding body define the light passing hole.

According to an embodiment of the present invention, a diameter of the light passing hole gradually decreases from a top side of the molding body toward the light transmitting element.

According to an embodiment of the present invention, the photosensitive assembly further includes at least one lead, wherein one end of the lead is electrically connected to the photosensitive element, and the other end of the lead is electrically connected to the circuit layer to electrically connect the photosensitive element and the circuit layer.

According to an embodiment of the present invention, the photosensitive assembly further includes at least one electronic component, wherein the electronic component is electrically connected to the circuit layer, extends upward from the circuit layer, and is encapsulated by the molding body.

According to an embodiment of the present invention, the circuit layer is provided on a light incident side of the photosensitive module, and the molding body supports the circuit layer, the circuit layer has a light passing hole, wherein the light passing hole corresponds to the photosensitive region of the photosensitive element.

According to an embodiment of the present invention, the circuit layer is implemented as an extended wiring layer formed by a re-wiring process.

According to an embodiment of the present invention, the photosensitive assembly further includes at least one conductive member, wherein the conductive member extends upward from the photosensitive element to the circuit layer on the light incident side, and electrically connects the circuit layer and the photosensitive element.

According to an embodiment of the present invention, the photosensitive assembly further includes at least one electronic component, wherein an electrical connection surface of the electronic component is on the light incident side, and is exposed with respect to the molding body, and is electrically connected to the circuit layer, wherein the molding body encapsulates and supports the electronic component.

According to an embodiment of the present invention, the molding body comprises a first molding body and a second molding body, wherein the first molding body encapsulates the photosensitive module and the conductive member, the light transmitting element and the conductive member are exposed with respect to the molding body on the light incident side, to form a molding single body, wherein the second molding body encapsulates the electronic component and the molding single body, the electrical connection surface of the electronic component is exposed with respect to the second molding body on the light incident side.

According to an embodiment of the present invention, the photosensitive assembly further includes a second extended wiring layer, wherein the extended wiring layer is provided on a bottom surface of the molding body, and the second extended wiring layer is electrically connect the circuit board.

According to another aspect of the present invention, the present invention further provides a camera module, including:

a photosensitive module, wherein the photosensitive module includes a photosensitive element, an isolation adhesive layer and a light transmitting element, wherein the photosensitive element has a photosensitive region and a non-photosensitive region, the isolation adhesive layer is provided on the non-photosensitive region, and supports the light transmitting element to be corresponding to the photosensitive region, wherein the isolation adhesive layer is formed by using photolithography technology;

a circuit layer, wherein the circuit layer is electrically connected to the photosensitive element;

a molding body, wherein the molding body encapsulates the photosensitive module and the circuit layer, wherein an exposed side of the light transmitting element is exposed to the outside for light to enter; and an optical lens, wherein the optical lens is mounted to be corresponding to the exposed light transmitting element to form a photosensitive path of the photosensitive module.

According to an embodiment of the present invention, the optical lens is drivably fixed to the photosensitive path of the photosensitive module.

According to an embodiment of the present invention, the optical lens is fixedly held to the photosensitive path of the photosensitive module.

According to another aspect of the present invention, the present invention further provides an electronic device, including:

a device body; and one or more camera modules described above.

According to another aspect of the present invention, the present invention further provides a method for manufacturing a photosensitive module, including:

(a) forming a plurality of isolation adhesive layers at a preset position of a chip wafer by a photolithography process, wherein the chip wafer has a plurality of photosensitive elements arranged in an array, and each photosensitive element is provided with the isolation adhesive layer in its non-photosensitive region;

(b) covering at least one light transmitting element on at least one of the isolation adhesive layers; and (c) cutting the chip wafer to form a plurality of photosensitive modules.

According to an embodiment of the present invention, the step (a) further includes the steps of:

(a.1) coating photosensitive material on the photosensitive surface of the chip wafer;

(a.2) selectively exposing the photosensitive material; and (a.3) using a developer to remove the photosensitive material in the preset region, exposing each photosensitive region, and forming the isolation adhesive layer in each non-photosensitive region.

According to an embodiment of the present invention, the step (a.1) further includes the step of:

spin-coating the photosensitive material so that the photosensitive material is evenly coated.

According to an embodiment of the present invention, the step (a.2) further includes the step of:

exposing the photosensitive material to be removed; and the step (a.3) further includes the step of:

using the developer to remove the exposed photosensitive material.

According to an embodiment of the present invention, the step (a.2) further includes the steps of:

exposing the photosensitive material to be left to form the isolation adhesive layer; and the step (a.3) further includes the step of: using the developer to remove the photosensitive material in the unexposed regions.

According to an embodiment of the present invention, in the step (b), the light transmitting element covers all of the isolation adhesive layer; and in the step (c), the light transmitting element is cut correspondingly to form the photosensitive module.

According to an embodiment of the present invention, in the step (b), the light transmitting element is monolithically covered on the corresponding isolation adhesive layer one by one.

According to another aspect of the present invention, the present invention further provides a method for manufacturing a photosensitive assembly, including the steps of:

(A) forming a plurality of isolation adhesive layers at a preset position of a chip wafer by a photolithography process, wherein the chip wafer has a plurality of photosensitive elements arranged in an array, and each photosensitive element is provided with the isolation adhesive layer in its non-photosensitive region;

(B) covering at least one light transmitting element on at least one of the isolation adhesive layers;

(C) cutting the chip wafer to form a plurality of the photosensitive modules;

(D) electrically connecting and arranging a plurality of the photosensitive modules on a circuit board jointed panel;

(E) forming a molding body on the circuit board panel through a molding process to encapsulate the photosensitive module and the circuit board jointed panel so as to form a photosensitive assembly jointed panel, wherein the molding body has a plurality of light passing holes corresponding to the photosensitive region of the photosensitive module; and (F) cutting the photosensitive assembly panel to form a plurality of photosensitive assemblies.

According to an embodiment of the present invention, before the step (E), further including the step of:

electrically connecting at least one electronic component on the circuit board jointed panel.

According to an embodiment of the present invention, in the step (E), the diameter of the light passing hole tends to become larger in a direction away from the photosensitive region.

According to an embodiment of the present invention, after the step (E), further including the step of:

grinding the top portion of the molding body until the light transmitting element of the photosensitive module is exposed.

According to another aspect of the present invention, the present invention further provides a method for manufacturing a photosensitive assembly, including the steps of:

(i) forming a plurality of isolation adhesive layers at a preset position of a chip wafer by a photolithography process, wherein the chip wafer has a plurality of photosensitive elements arranged in an array, and each photosensitive element is provided with the isolation adhesive layer in its non-photosensitive region;

(ii) covering at least one light transmitting element on at least one of the isolation adhesive layers;

(iii) cutting the chip wafer to form a plurality of the photosensitive modules;

(iv) conductively mounting at least one conductive member on the non-photosensitive region of the photosensitive element;

(v) arranging the photosensitive modules on a substrate in an array;

(vi) forming a molding body on the substrate through a molding process to encapsulate the photosensitive module and the conductive member;

(vii) mounting a circuit layer on the surface of the molding body on a light incident side, wherein the circuit layer is conductively connected to the conductive member, wherein the circuit layer has a plurality of light passing holes corresponding to the photosensitive paths of the photosensitive element, to form a photosensitive assembly jointed panel; and (viii) cutting the photosensitive assembly jointed panel to form a plurality of photosensitive assemblies.

According to an embodiment of the present invention, the step (vii) further includes the step of:

(vii.1) forming an extended wiring layer on the surface of the molding body on the light incident side by a re-wiring process, wherein the extended wiring layer is conductively connected to the conductive member, wherein the extended wiring layer has a plurality of light passing holes corresponding to the photosensitive paths of the photosensitive element, to form the photosensitive assembly jointed panel.

According to an embodiment of the present invention, the step (vi) further includes the step of:

(vi.1) exposing the conductive member and the light transmitting element with respect to the molding body.

According to an embodiment of the present invention, the step (v) further includes the step of:

providing at least one electronic component on the substrate, wherein an electrical connection surface of the electronic component is away from the substrate; in the step (vi), the molding body encapsulates the electronic component, the photosensitive module, and the conductive member; and in the step (vii), the circuit layer is electrically connected with the electrical connection surface of the electronic component.

According to an embodiment of the present invention, the step (vi) further includes the step of:

(vi.2) forming a first molding body integrally encapsulating the photosensitive module and the conductive member through a molding process to form a molding single body;

(vi.3) exposing the light transmitting element and the conductive member to the first molding body;

(vi.4) turning over the molding single body and arranging in an array on the substrate so that the photosensitive surface of the photosensitive element faces the substrate;

(vi.5) providing at least one electronic component on the substrate, wherein an electrical connection surface of the electronic component contacts the substrate; and (vi.6) integrally encapsulating the molding single body and the electronic component through a molding process to form a second molding body.

According to an embodiment of the present invention, the step (vii) further includes the steps of:

(vii.2) turning over the second molding single body so that the non-photosensitive surface of the photosensitive element faces the substrate, and the electrical connection surface of the electronic component is away from the substrate;

(vii.3) electrically connecting and mounting the circuit layer and the conductive member, the electrical connection surfaces of the electronic component, and the circuit layer has a plurality of light passing holes corresponding to the photosensitive paths of the photosensitive element to form the photosensitive assembly jointed panel.

BRIEF DESCRIPTION OF THE DRAWINGS

FIG. 14 is a manufacturing process diagram of the photosensitive assembly according to the variant embodiment of the second preferred embodiment.

FIG. 15 is a flow chart of preparation of the photosensitive module according to the first preferred embodiment.

FIG. 16 is a flow chart of preparation of the photosensitive assembly according to the first preferred embodiment.

DETAIL DESCRIPTION OF THE INVENTION

Figures 1, 2:
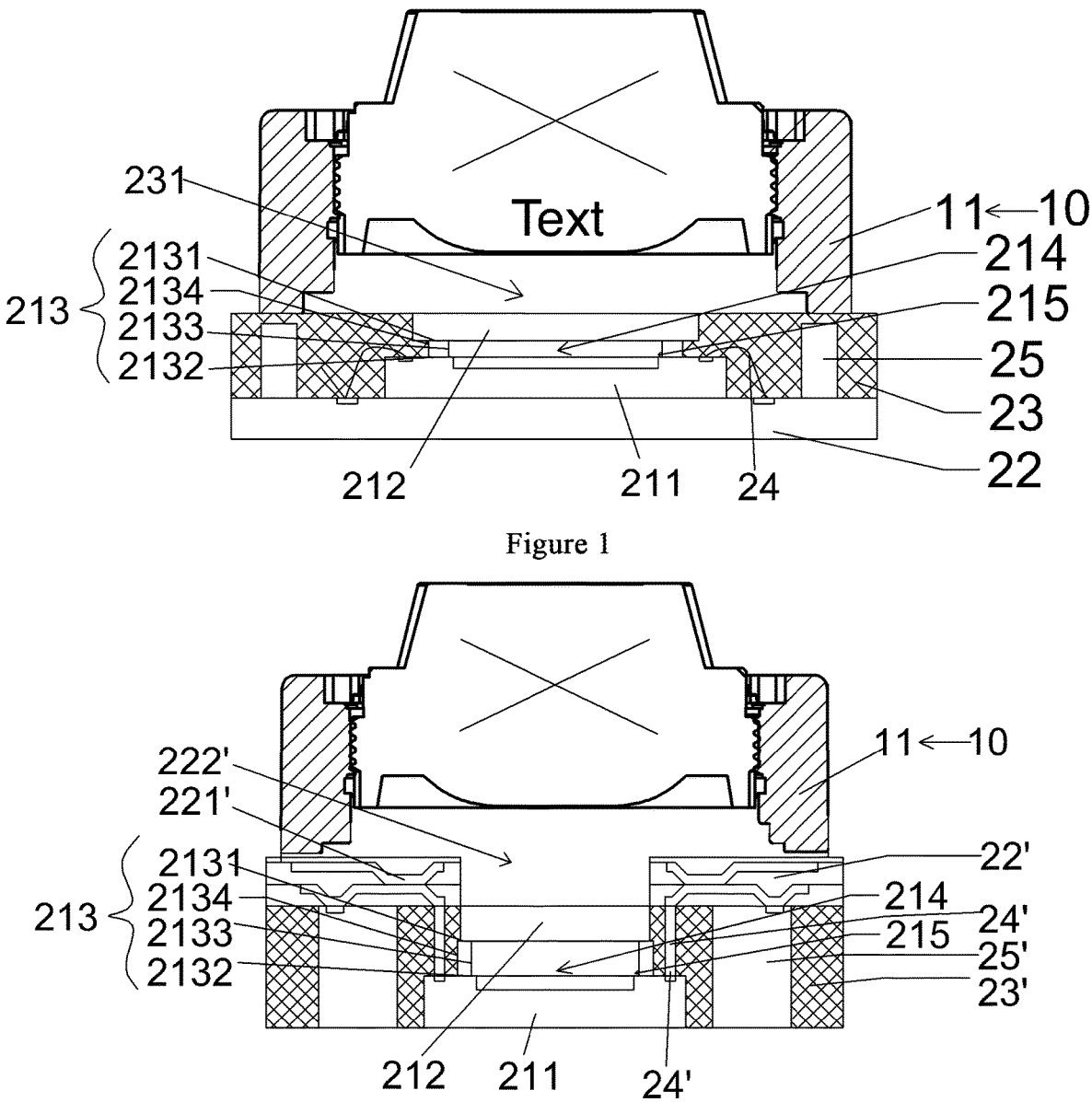
FIG. 1 is a schematic structural diagram of a camera module according to a first preferred embodiment.
FIG. 2 is a schematic structural diagram of a camera module according to a second preferred embodiment.

The following description is used to disclose the present invention to enable those skilled in the art to implement the present invention. The preferred embodiments in the following description are only examples, and those skilled in the art can think of other obvious modifications. The basic principles of the present invention defined in the following description can be applied to other embodiments, modifications, improvements, equivalent solutions, and other technical solutions without departing from the spirit and scope of the present invention.

Those skilled in the art should understand that in the disclosure of the present invention, orientation or positional relationship indicated by the terms "portrait", "landscape", "upper", "lower", "front", "rear", "left", "right", "vertical", "horizontal", "top", "bottom", "inner", "outer", etc. is based on the orientation or positional relationship shown in the drawings, which is only for the convenience of describing the present invention and simplify the description, rather than indicating or implying that the device or element referred to must have a specific orientation, be constructed and operated in a specific orientation, and therefore the above terms should not be construed as limiting the present invention.

It can be understood that the term "a" should be understood as "at least one" or "one or more", that is, in one embodiment, the number of an element can be one, and in other embodiments, the number of the element can be more than one, and the term "one" cannot be understood as a limitation on the number.

As shown in FIG. 1, a camera module of a first preferred embodiment of the present invention is illustrated, wherein the camera module can be applied to various electronic devices, such as but not limited to a smart phone, a wearable device, a computers equipment, a television, a vehicle, a camera, a monitoring equipment, etc. The camera module cooperates with the electronic device to realize functions such as collection and reproduction of target images.

The camera module includes a photosensitive assembly 20 and an optical lens 10. The optical lens 10 is held in a photosensitive path of the photosensitive assembly 20 to collect image information of measured target through the optical lens 10. In the preferred embodiment of the present invention, the camera module is a fixed focus camera module, that is, a distance between the optical lens 10 and a photosensitive member of the photosensitive assembly 20 is not adjustable. As shown in FIG. 1, the optical lens 10 is assembled at a corresponding position on a top side of the photosensitive assembly 20 through a lens carrying element 11. Wherein, in the preferred embodiment of the present invention, the lens carrying element 11 is implemented as a supporting lens barrel, which is a static supporting structure. In other words, a function of the supporting lens barrel is to limit the optical lens 10 to the top surface of the photosensitive assembly 20. At this time, the relative positional relationship between the optical lens 10 and the photosensitive assembly 20 is maintained constant, that is, the camera module is a fixed focus camera module.

It is worth mentioning that, in another embodiment of the present invention, the camera module may be implemented as a dynamic focus camera module, that is, the distance between the optical lens 10 and the photosensitive member of the photosensitive assembly 20 is adjustable. At this time, the lens carrying element 11 is implemented as a driving element, wherein the optical lens 10 is mounted on the driving element, and the driving element is fixed on the top side of the photosensitive assembly 20. When the driving element is driven, the driving element carries the optical lens 10 to move correspondingly along the photosensitive path, so that the distance between the optical lens 10 and the photosensitive assembly 20 changes accordingly, namely, the focal power of the camera module changes. It is worth mentioning that the driving elements include, but are not limited to, a voice coil motor, a stepper motor, MEMS, etc.

Those skilled in the art should know that as a camera module packaging technology improves, a size of the photosensitive assembly 20 becomes smaller and smaller, so that in some embodiments of the present invention, the optical lens 10 may be directly assembled on the top side of the photosensitive assembly 20. That is, at this time, the optical lens 10 does not have the lens carrying element 11 but is directly assembled at a corresponding position on the top side of the photosensitive assembly 20 in a "bare lens" manner. It should be appreciated that when the optical lens 10 is assembled in a "bare lens" manner, the size of the camera module can be further reduced, so that a space that occupied by the camera module in the electronic device can be further reduced to meet current development trend of a large screen ratio of electronic equipment.

Further, in the first preferred embodiment of the present invention, the photosensitive assembly 20 includes a photosensitive module 21, a circuit layer 22, and a molding body 23, and light of the measured object collected by the optical lens 10 has an imaging reaction at the photosensitive module 21 to realize conversion of an optical signal into an electrical signal. The photosensitive module 21 is electrically connected to the circuit layer 23 to supply power and transmit signal to the photosensitive module 21 through the circuit layer 22, thereby transmitting the image information collected by the photosensitive module 21 to an electronic device, the molding body 23 integrally molds the photosensitive module 21 and the circuit layer 22.

Specifically, the photosensitive module 21 includes a photosensitive element 211 for receiving image information, and the photosensitive element 211 further includes a light transmitting element 212 for filtering infrared rays or the like that affect the imaging quality of the photosensitive element 211. The light transmitting element 212 may be an infrared filter, an ultraviolet filter, a blue glass, or the like.

In the prior art, the light transmitting element 212 is usually mounted on the lens holder first, and then assembled with the photosensitive element on the circuit board, so as to maintain a certain distance between the light transmitting element and the photosensitive element to prevent their mutual squeezing and destroying the microlens structure on the surface of the photosensitive element, also prevent dirt on the light transmitting element from being imaged on the photosensitive element due to a too close distance between the light transmitting element and the photosensitive element, which affects the imaging quality of the camera module. However, the lens holder is usually formed by an injection molding process, and due to the limitation of the injection molding process, its height is often at least 200 um or more, so as to limits the height and size of the camera module to be further reduced, which is contrary to market demand.

In the existing process, another method is to arrange a circle of glue around the photosensitive region of the photosensitive element through a dispensing process on the surface of the photosensitive element, and cure it by exposure or baking to support the light transmitting element, thereby reducing the mounting height of the light transmitting element. However, in this technology, the glue is easy to collapse to both sides because it is liquid before being cured, that is, after the dispensing is completed, the glue will extend laterally, and when the glue extends to the photosensitive region of the photosensitive element, it will affect its performance, thereby reducing the imaging quality of the camera module.

On the other hand, an isolation adhesive layer formed by the dispensing process cannot guarantee flatness of the its top surface, that is to say, in this solution, a parallelism between the light transmitting element and the photosensitive element cannot be guaranteed. In case that it is not parallel to the photosensitive element, the filtering effect of the light transmitting element will be affected, and even bring a certain aberration. In addition, in case that the surface of the isolation adhesive layer is not flat, because the surface of the light transmitting element is a flat surface, there is bound to be a gap between the two when the light transmitting element is mounted on the isolation adhesive layer. Thus in the subsequent molding process, the molding material will enter the sealed space through the gap, thereby contaminating the photosensitive element.

In the present invention, the photosensitive module further includes an isolation adhesive layer 213 provided between the photosensitive element 211 and the light transmitting element 212 and for supporting the light transmitting element 212. The light transmitting element 212 is mounted on a top surface 2131 of the isolation adhesive layer 213, so that the light transmitting element 212 is held above the photosensitive element 211, so that the light passing through the lens 10 is subjected to the filtering effect of the color filter 60 and then reaches the photosensitive element 40 to be photosensitive.

Figure 4:
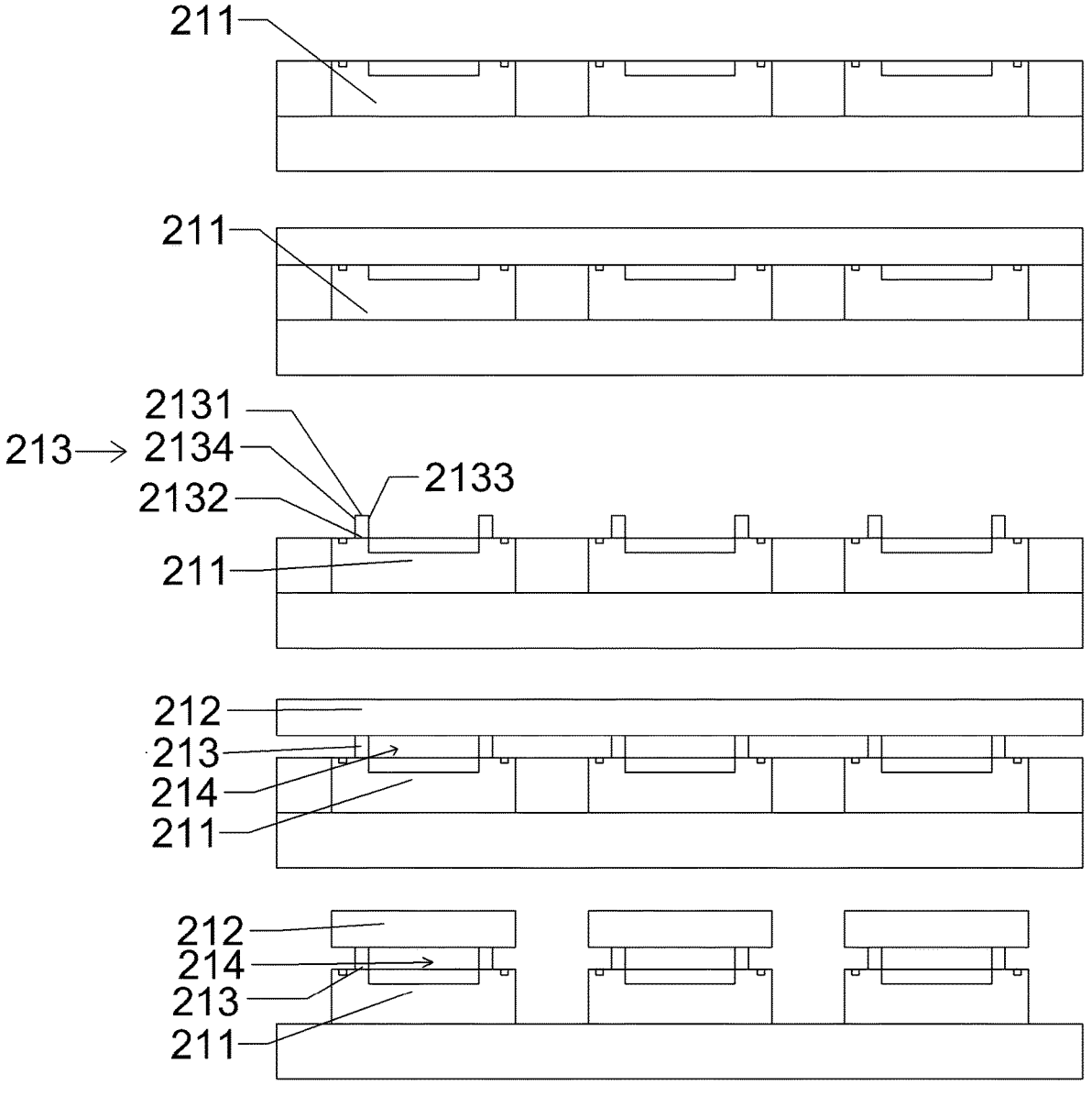
FIG. 4 is a manufacturing process diagram of the photosensitive module according to the first preferred embodiment.

As shown in FIG. 4, the isolation adhesive layer 213 is formed in a preset region of the photosensitive element 211 through a photolithography process, and the photolithography process includes: spin-coating photosensitive material on a photosensitive surface of a chip wafer including multiple photosensitive elements, exposing selective areas of the photosensitive material to light, and physical properties of the photosensitive regions exposed to the light change. In one embodiment of the present invention, changes in the physical properties of the exposed region will cause the exposed region to be etched away when an etchant such as a developer is applied to the photosensitive material layer. Of course, it can be understood that in another embodiment of the present invention, the unexposed region may be etched away.

The isolation adhesive layer 213 formed by the photolithography process can have a lower height compared to the conventional lens holder and the isolation adhesive layer formed by dispensing, that is, the light transmitting element 212 has a lower mounting surface, so that it can further reduce the assembly height of the optical lens 10 when it is assembled to the photosensitive assembly 20, so as to reduce a height dimension of the camera module. On the other hand, since the photosensitive material is formed on the surface of the photosensitive element 211 through a spin coating process, it has a relatively high flatness. Therefore, the top surface 2131 of the isolation adhesive layer 213 has a higher flatness relative to the isolation adhesive layer formed by the dispensing process, thereby ensuring the parallelism between the light transmitting element 212 and the photosensitive element 211.

It is worth mentioning that the isolation adhesive layer 213 formed by the photolithography process is less susceptible to deformation due to the external environment than the isolation adhesive layer prepared by the dispensing process, so the isolation adhesive layer 213 in use can maintain its geometric shape well, for example, it is not easy to be deformed by compression or deformed under high temperature, thus preventing the isolation adhesive layer 213 from being reduced in height and widened in width due to deformation after formation, thereby preventing it from extending to the photosensitive region 2111 or to the electrical connector of the photosensitive element.

It can be understood that, in another embodiment of the present invention, the isolation adhesive layer 213 may also be formed in a preset region of the light transmitting element 212 through a photolithography process, and has a flat bottom surface 2132. The photosensitive element 211 is mounted on the bottom surface 2132 of the isolation adhesive layer 213. Therefore, regardless of whether the isolation adhesive layer 213 is formed on the photosensitive element 211 or the light transmitting element 212, the transmitting element 212 and the photosensitive element 211 can also be kept almost parallel and can keep its geometry.

Figure 3:
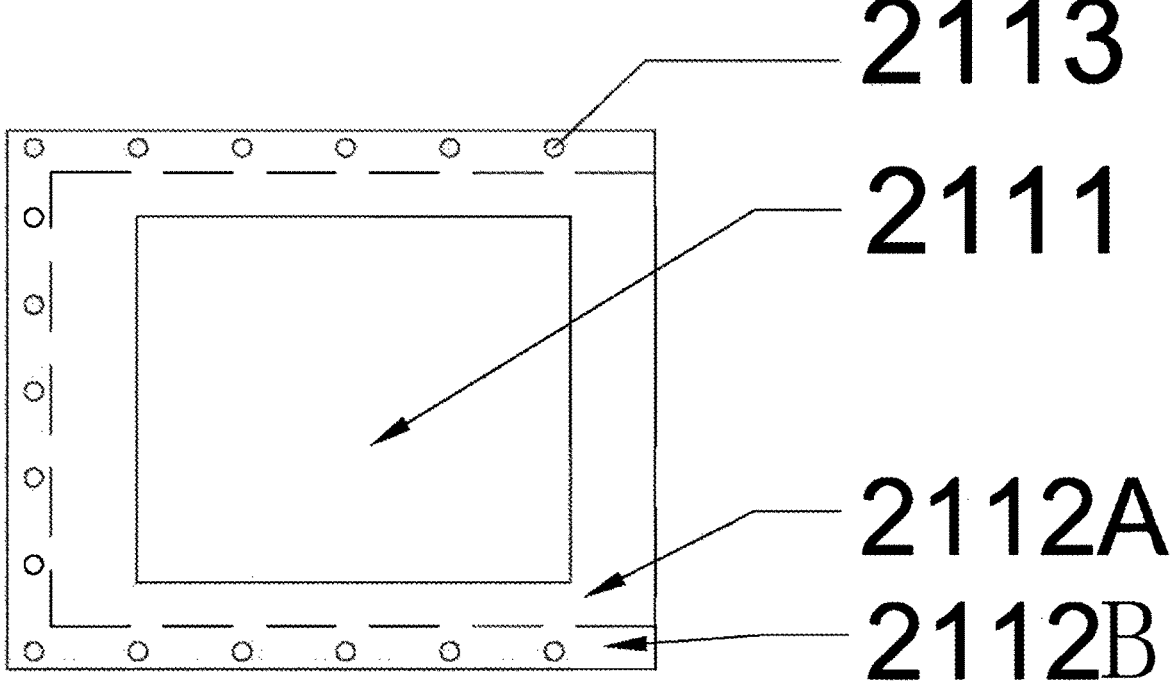
FIG. 3 is a vertical view of a photosensitive element in the present invention.

Further, as shown in FIG. 3, the photosensitive element 211 has a photosensitive region 2111 and a non-photosensitive region 2112. The photosensitive region 2111 is used to receive light signals and generate corresponding electrical signals. The isolation adhesive layer 213 is provided on the non-photosensitive region 2112 of the photosensitive element 211. The photosensitive element 211 has at least one electrical connector 2113 in the non-photosensitive region 2112. The electrical connector 2113 is electrically connected to the circuit layer 22 to transmit the electrical signal generated by the photosensitive element 211 to the electronic device through the circuit layer 22.

Therefore, the isolation adhesive layer 213 is provided on the non-photosensitive region 2112 and is configured to be separated from the electrical connection 2113 to prevent it from affecting the electrical connection 2113 to be electrically connected to the circuit layer 22.

In this embodiment, the isolation adhesive layer 213 has a closed annular structure to surround the photosensitive element 211 and expose at least the photosensitive region 2111 of the photosensitive element 211, so that an enclosed space 214 is formed between the light transmitting element 212 and the photosensitive elements 211. This closed annular structure can prevent the molding material from entering the enclosed space 214 and contaminating the photosensitive region 2111 of the photosensitive element 211 in the subsequent molding process of forming the molding body 23. On the other hand, both the light transmitting element 212 and/or the photosensitive element 211 need to be fixed to the isolation adhesive layer 213 with glue, so that the isolation adhesive layer 213 of the closed annular structure can effectively prevent the glue from overflowing to the enclosed space 214, and affecting the imaging of the photosensitive element 211, and even causing the photosensitive element 211 to be failed, thereby improving the yield of the camera module.

Specifically, the isolation adhesive layer 213 has an annular inner side surface 2133, which defines a lateral boundary of the enclosed space 214 (this lateral direction refers to a direction parallel to the photosensitive surface of the photosensitive element), the isolation adhesive layer 213 further includes an outer side surface 2134 corresponding to the inner side surface 2133. When the isolation adhesive layer 213 is provided on the photosensitive element 211, the non-photosensitive region 2112 of the photosensitive element 211 is divided into a space region 2112A covered by the isolation adhesive layer 213, and an electrical connection region 2112B not covered by the isolation adhesive layer 213, that is, the outer side surface 2134 of the isolation adhesive layer 213 divides the non-photosensitive region 2112 into the space region 2112A and the electrical connection region 2112B.

With advances in technology and market needs, in order to increase the pixel requirements of the camera module, the area of the photosensitive region 2111 of the photosensitive element 211 must be enlarged. At the same time, the camera module requires a trend toward miniaturization, that is, the overall size of the photosensitive element 211 needs to be reduced. In order to meet the two technical requirements at the same time, the range of the non-photosensitive region 2112 of the photosensitive element 211 is inevitably reduced. Therefore, the space region 2112A for disposing the isolation adhesive layer 213 will also be compressed to smaller, because the precision and limit width of the dispensing process are limited, and after the dispensing process is completed, the glue will gradually collapse and spread to the photosensitive region 2111 before being cured, so the technology of forming the isolation adhesive layer by the dispensing process will no longer be suitable.

In the present invention, the isolation adhesive layer 213 formed by the photolithography process has a higher forming precision and a narrower limit width, and after the isolation adhesive layer 213 is formed, it can maintain its geometric shape better, will not collapse to both sides, so that in the case where the space region 2112A is narrow, the isolation adhesive layer 213 can still be formed in the space region 2112A through a photolithography process and does not extend to the photosensitive region 2111. On the other hand, when the area of the top surface 2131 of the isolation adhesive layer 213 in contact with the light transmitting element 212 is the same, since the side of the isolation adhesive layer 213 prepared by the photolithography process is almost vertical, the area of the bottom surface 2132 of the isolation adhesive layer 213 in contact with the photosensitive element 211 may be the smallest, thereby a size of the spaced region 2112A of the photosensitive element 211 covered by the isolation adhesive layer 213 is smaller, that is to say, the area of the photosensitive element 211 is also reduced.

Preferably, the inner side surface 2133 of the isolation adhesive layer 213 is close to the outer edge of the photosensitive region 2111 of the photosensitive element 211, but does not contact the outer edge of the photosensitive region 2111, that is, there is a certain distance between the inner side surface 2133 of the isolation adhesive layer 213 and the photosensitive region 2111, thereby preventing the isolation adhesive layer 213 from contacting the edge of the photosensitive region 2111, thereby affecting the performance of the photosensitive element 211. On the other hand, in case that there is a certain distance between the inner side surface 2133 of the isolation adhesive layer 213 and the photosensitive region 2111, a overflowing glue space 215 will be formed between the outer edge of the photosensitive region 2111 and the inner side surface 2133 of the isolation adhesive layer 213, so that when the glue used to fix the light transmitting element 212 and the isolation adhesive layer 213 is spread from the inner side surface 2133 of the isolation adhesive layer 213, the overflowing glue space 215 is able to accommodate a small amount of overflowing glue, thereby preventing the overflowing glue from directly extending to the photosensitive region of the photosensitive element 211. It is worth mentioning that in case that the inner side surface 2133 is a vertical side surface, its height is very small, that is, even in case that its surface area is very small, It will also brings a problem that stray light is reflected from the inner side surface 2133 to the photosensitive region 2111 of the element 211, while by maintaining a certain distance between the inner side surface 2133 and the photosensitive region 2111, formation of stray light can be reduced.

Further, as shown in FIG. 1, in the first preferred embodiment of the present invention, the circuit layer 22 is implemented as a circuit board, for example, a PCB board used in a conventional process. The circuit board 22 is provided on the bottom side of the photosensitive module 21, that is, the photosensitive module 21 is attached to the circuit board 22, and the photosensitive assembly 20 further includes a conductive member 24. In the embodiment, the conductive member 24 is implemented as a lead, that is, one end of the lead 24 is electrically connected to the electrical connector 2113 of the photosensitive element 211 through a wire bonding process, and the other end of the lead 24 is electrically connected to the circuit layer 22 to realize the electrical connection between the photosensitive element 211 and the circuit layer 22. It is worth mentioning that, since the isolation adhesive layer 213 formed by the photolithography process has a lower height, when performing the wire bonding process, due to the need to avoid the isolation adhesive layer 213 and the light transmitting element 212, inclination angle at which the needle is arranged can be smaller, that is, because the isolation adhesive layer 213 has a lower height, it will not affect the direction of the needle in the wire bonding process too much, and will not increase difficulty of the wire bonding too much.

Figure 6:
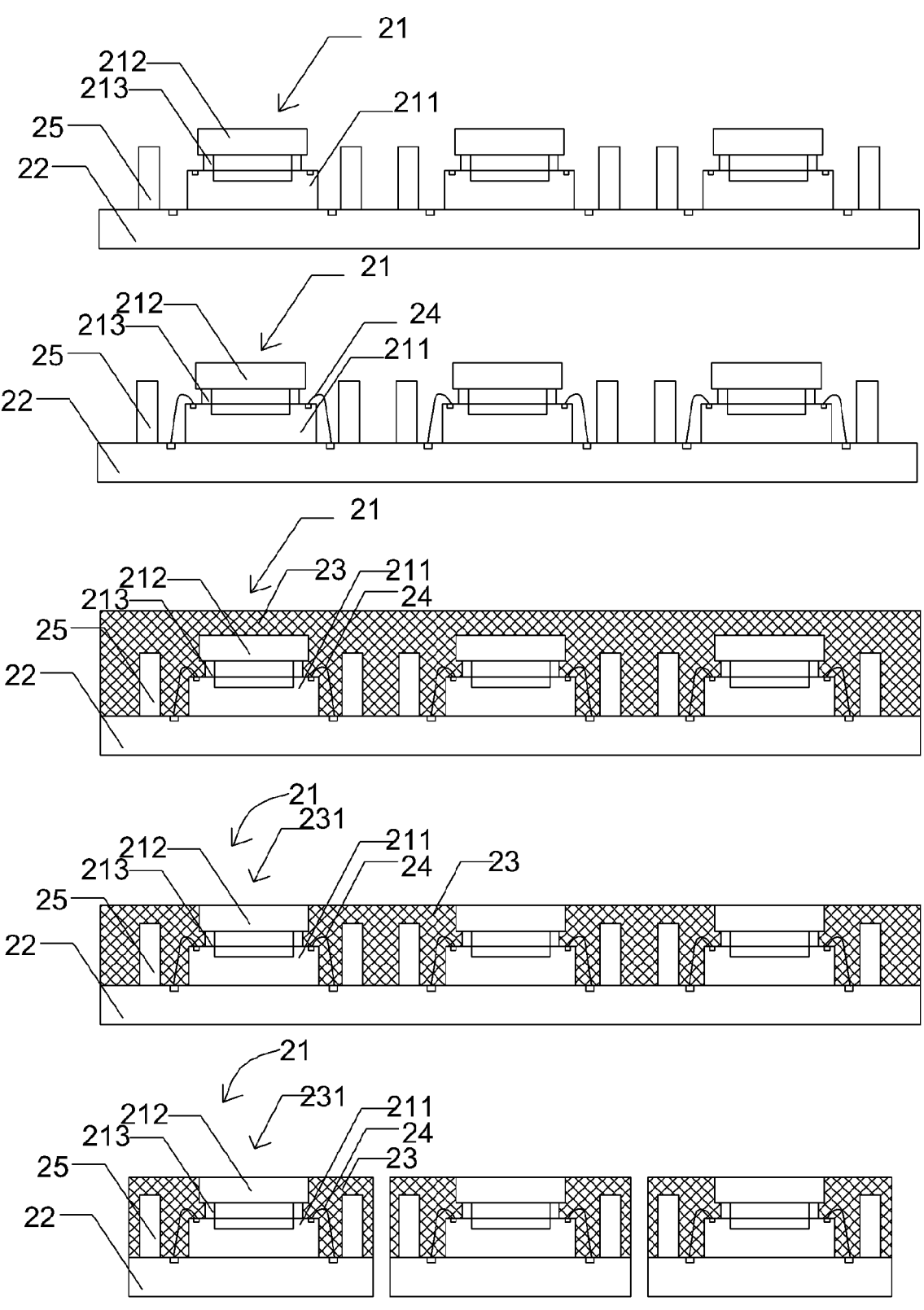
FIG. 6 is a manufacturing process diagram of the photosensitive assembly according to the first preferred embodiment.

Further, as shown in FIG. 6, the molding body 23 is formed by a molding process, which integrally molds the photosensitive module 21, the circuit board 22 and the conductive member 24, thereby constituting the photosensitive assembly 20.

Further, the camera module may further include at least one electronic component 25, and the electronic component 25 may be one or a combination of one or more of a capacitor, a resistor, an inductor, a diode, and a triode. In this embodiment, the electronic component 25 is attached to the circuit board 22 and electrically connected to the circuit board 22. When the molding body 23 is formed by a molding process, the electronic component 25 is packaged in the molding body 23 together with the photosensitive module 21, the circuit layer 22 and the conductive member 24.

In one embodiment of the present invention, the molding body 23 is formed by transfer molding, that is, the die used in the molding process has an indenter, which will cover the upper surface of the light transmitting element 211 to form a light passing hole 231 for light to reach the photosensitive module 21 through the light passing hole 231 after the die is clamped.

Figure 7:
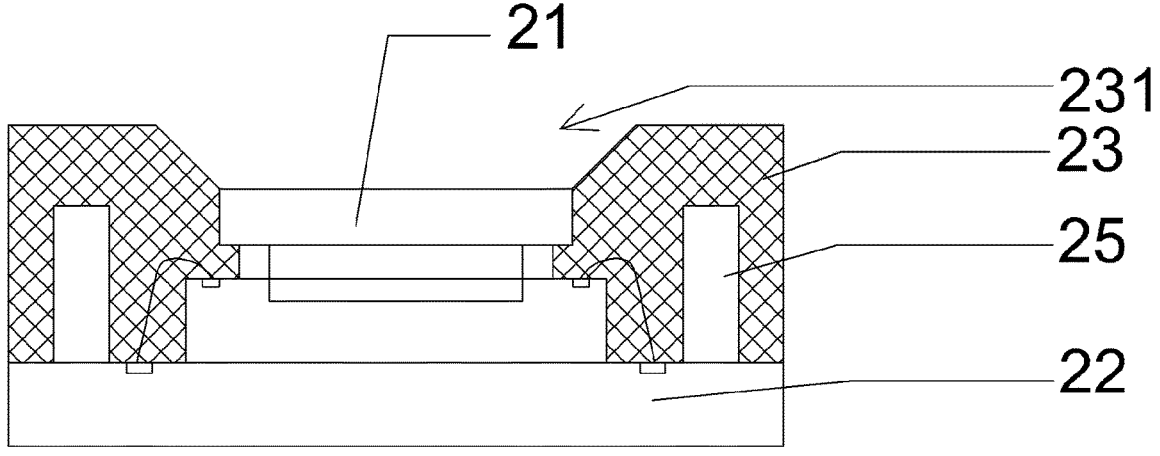
FIG. 7 is a schematic structural view of the photosensitive assembly according to the first preferred embodiment.

Preferably, the indenter has a shape that increases from bottom to top, so that the light passing hole 231 formed at the indenter has a shape that increases from bottom to top, as shown in FIG. 7, In other words, a side surface of the molding body 23 at the light passing hole 231 is an inclined slope, so that stray light at a certain angle cannot be reflected from the side surface to the photosensitive element 211, thereby improving the imaging quality of the camera module.

Figure 8:
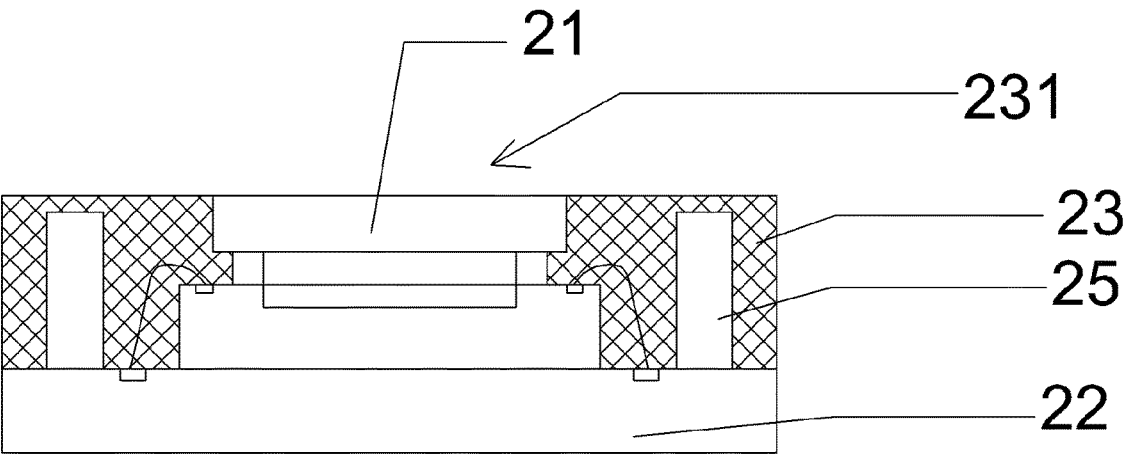
FIG. 8 is a schematic structural view of the photosensitive assembly according to the first preferred embodiment.

In one embodiment of the present invention, as shown in FIG. 6, the molding body 23 is formed by a compression molding process, and the molding body 23 formed by the compression molding process will cover the upper surface of the light transmitting element 212, then, the molded body 23 is thinned by grinding and polishing, so that the light transmitting element 212 is exposed on the surface of the molding body 23. As a result, the molding body 23 and the light transmitting element 212 have a smaller thickness, thereby reducing the thickness of the photosensitive assembly 20. The molding body 23 has the light passing hole 231, and the light transmitting element 212 is accommodated in the light passing hole 231. Its structure is shown in FIG. 8.

It can be understood that compression molding is more suitable for large-scale production, that is, more products can be produced in the same batch, which is advantages to improving production efficiency. Therefore, in this embodiment, the circuit board jointed panel used is no longer a soft and hard combination board in the traditional process, but only a hard board jointed panel (such as a PCB board), and a plurality of the photosensitive modules 21 are attached to a circuit board jointed panel, a large number of the photosensitive module 21, the circuit board 22, the conductive member 24 and the electronic component 25 are packaged at a time through a molding process to form a plurality of the photosensitive assembly 20, thereby improving production efficiency. After the molding is completed, a molding jointed panel is formed, wherein the molding jointed panel includes a plurality of the photosensitive assemblies 20, and the molding jointed panel is cut to form a single photosensitive assembly 20 to form a single body of the photosensitive assembly 20, then the FPC soft board is attached to the circuit board 22.

In an embodiment of the present invention, a filter layer may be applied on the upper surface of the light transmitting element 212 exposed with respect to the molding body 23, and the filter layer may be a light filtering coating such as an anti-reflection film, an infrared cut-off film, or the like, which enables the light transmitting element 212 to filter out infrared light or the like that affect the image quality.

It is worth mentioning that, in an embodiment, the side surface of the light transmitting element 212 may be roughened, so that the molding body 23 covering the light transmitting element 211 has a rough side surface at the light passing hole 231, thereby reducing the formation of stray light. In another embodiment, the light transmitting element 212 is processed to have an inclined side surface, so that the molding body 23 covering the light transmitting element 211 has an inclined side surface, that is to say, the light passing hole has a shape that increases from bottom to top, so that stray light at a certain angle cannot be reflected from the side to the photosensitive element 211, thereby improving the imaging quality of the camera module.

As shown in FIG. 2, a camera module of a second preferred embodiment of the present invention is illustrated. The camera module includes a photosensitive assembly 20 and an optical lens 10, and the optical lens 10 is held in a photosensitive path of the photosensitive assembly 20 to collect image information of a measured object through the optical lens 10. The photosensitive assembly 20 includes a photosensitive module 21, a circuit layer 22', a molding body 23' and at least one electronic component 25, wherein the optical lens 10, the photosensitive module 21 and the structure of the electronic component 25 in the embodiment are the same as those in the first preferred embodiment, so it will not be described in detail.

The photosensitive assembly 20 further includes a conductive member 24'. In this embodiment, an electrical connection end of the conductive member 24' is electrically connected to the electrical connector 2113 of the photosensitive element 211 and extends upward from the photosensitive element 211 in a direction away from the photosensitive element 211. The conductive member 24' may be formed through a suitable process, such as electroplating, sputtering, deposition, etc., and the conductive member 24' is formed of a conductive material. In some embodiments, the conductive material may include metals, such as copper or copper alloys, and may also include other metals, such as aluminum, silver, gold, combinations of the foregoing, and similar materials.

In one embodiment of the present invention, when the photosensitive material is exposed and developed through a photolithography process to form the isolation adhesive layer 213, a through hole accommodating a part of the conductive member 24' is formed in the photosensitive material at a region corresponding to the conductive member 24', a part of the conductive member 24' is formed at the through hole by suitable processes such as electroplating, sputtering, and deposition, and then after the light transmitting element 212 is mounted, the remaining part of the conductive member 24' is formed on the formed part of the conductive member 24'. It can be understood that the conductive member 24' may also be formed on the photosensitive element 211 after the photosensitive module 21 is prepared.

Figure 9:
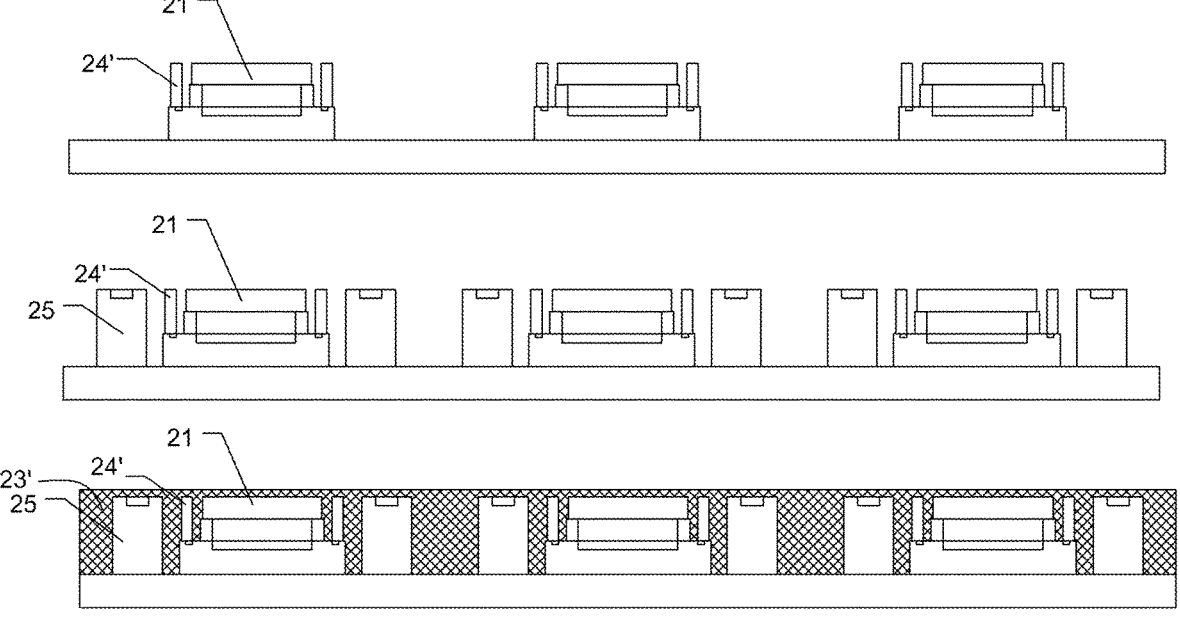
FIG. 9 is a manufacturing process diagram of the photosensitive assembly according to the second preferred embodiment.

Further, the molding body 23' is integrally molded and encapsulates the photosensitive module 21, the conductive member 24' and the electronic component 25, and the molding body 23' is formed by a molding process, as shown in FIG. 9, when the molding body 23' is formed, both the light transmitting element 212 and the isolation adhesive layer 213 can block the molding material and prevent it from entering the enclosed space 214, so that it can plays a protective role for the photosensitive element 211. Moreover, the photosensitive module 21 has higher structural strength than the single-piece photosensitive element 211, thereby preventing the photosensitive element 211 from being damaged or bent due to stress when the molding body 23 is formed.

Figure 10:
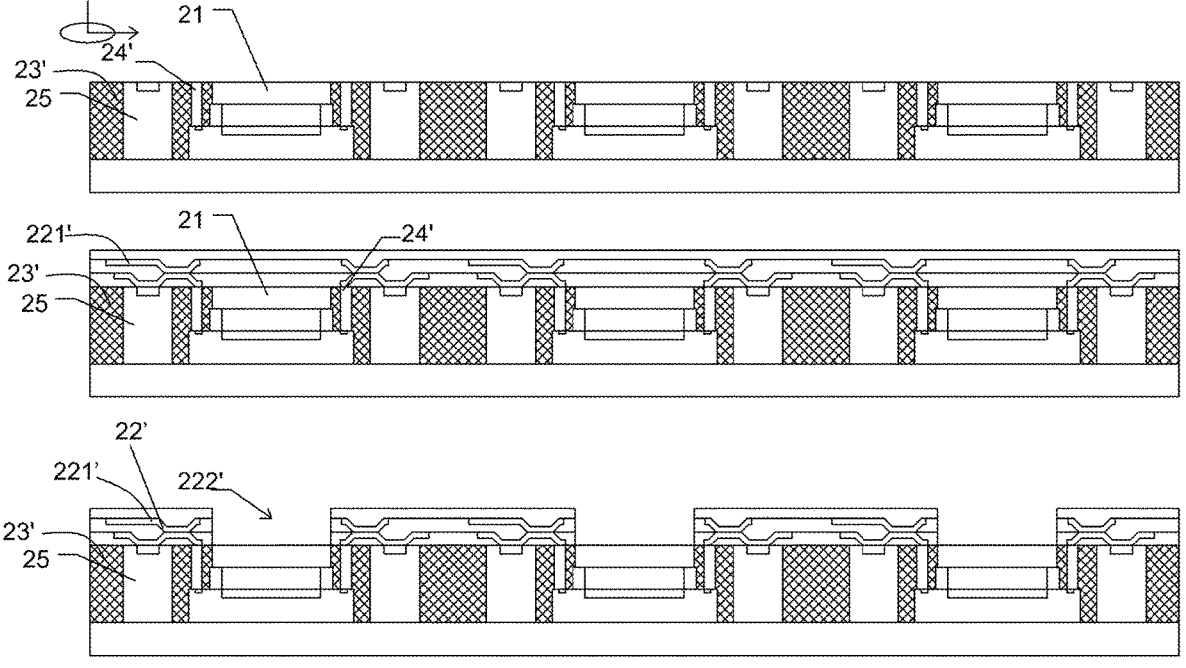
FIG. 10 is a manufacturing process diagram of the photosensitive assembly according to the second preferred embodiment.

Further, as shown in FIGS. 9 and 10, in this embodiment, the molding body 23' formed by the molding process covers the upper surface of the light transmitting element 212 and the electrical connection surface of the electronic component 25, the light transmitting element 212 and the electrical connector of the electronic component 25 are exposed with respect to the molding body 23' by grinding and polishing.

Further, a light filter layer may be applied on the exposed upper surface (exposed side), and the light filter layer may be a light filter coating such as an antireflection film, an infrared cutoff film, etc., so that the light transmitting element 212 has the function of filtering infrared light. In particular, a height of the conductive member 24' should be higher than or equal to a final height of the light transmitting element 212, so that after grinding and polishing, the light transmitting element 212 can be exposed to the surface of the molding body 23, at the same time, the conductive member 24' can also be exposed to the surface of the molding body 23 to serve as another electrical connection end of the conductive member 24' to electrically connect the extended wiring layer 22'.

Further, in this embodiment, as shown in FIG. 10, the circuit layer 22' is implemented as an extended wiring layer 22', and the extended wiring layer 22' is formed on the molding body 23' through a rewiring process, the extended wiring layer 22' includes an extended wiring circuit 221'.

The rewiring process includes: spin-coating the photosensitive material, exposing the selective area of the photosensitive material to light, and changing the physical properties of the photosensitive region exposed to the light. The change of the physical properties of the exposed region will cause the exposed area to be etched when the developer is applied to the photosensitive material layer. Of course, it can be understood that, in another embodiment of the present invention, the unexposed area may also be etched. Then, the extended wiring circuit 221' of the extended wiring layer 22' is formed in the photosensitive material layer by a suitable process such as sputtering, evaporation, deposition, etc. The extended wiring circuit 221' is electrically connected to the conductive member 24', so that the electrical connection between the extended wiring circuit 221 and the photosensitive element 211 is achieved through the conductive member 24'. The electronic component 25 is electrically connected to the extended wiring layer 22' and extends downward from the extended wiring layer 22'.

The extended wiring circuit 221' extends laterally from the conductive member 24' in a direction away from the photosensitive element 211, whereby the extended wiring circuit 221' does not cover the photosensitive region 2111 of the photosensitive element 211. Further, as shown in FIG. 10, through a suitable process, such as etching, laser cutting, etc., a part of the photosensitive material of the extended wiring layer 22' is removed to form a light passing hole 222' corresponding to the photosensitive region of the photosensitive element 211, because the light transmitting element 212 covers the photosensitive element 211, when the light transmitting element removes the photosensitive material corresponding to the photosensitive element, it plays a protective role for the photosensitive element 211 to prevent it from being damaged due to the greater intensity of etching or cutting.

Figure 11:
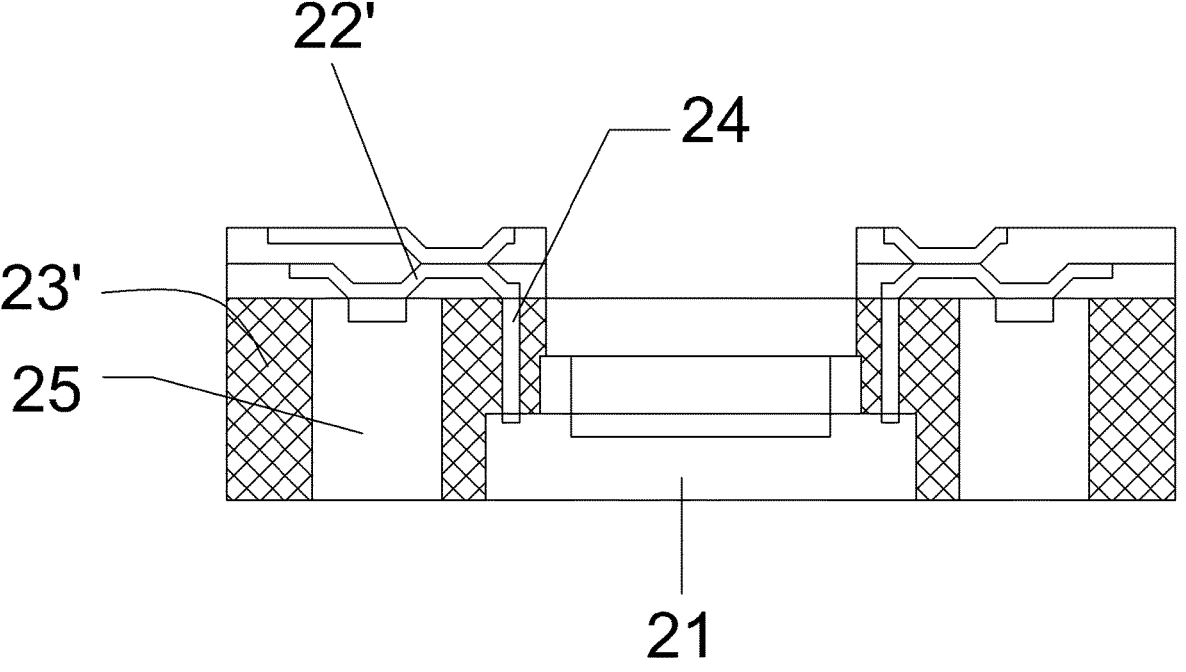
FIG. 11 is a schematic structural view of the photosensitive assembly according to the second preferred embodiment.

In this embodiment, after removing a part of the photosensitive material to form the light passing hole 222', a photosensitive assembly jointed panel is formed, and the jointed panel is cut to obtain the photosensitive assembly 20 of the second preferred embodiment of the present invention as shown in FIG. 11. It can be understood that, part of the photosensitive material may be removed after cutting the jointed panel to form the light passing holes 222'. The order of the process steps has no effect on the structure of the present invention.

Figure 12:
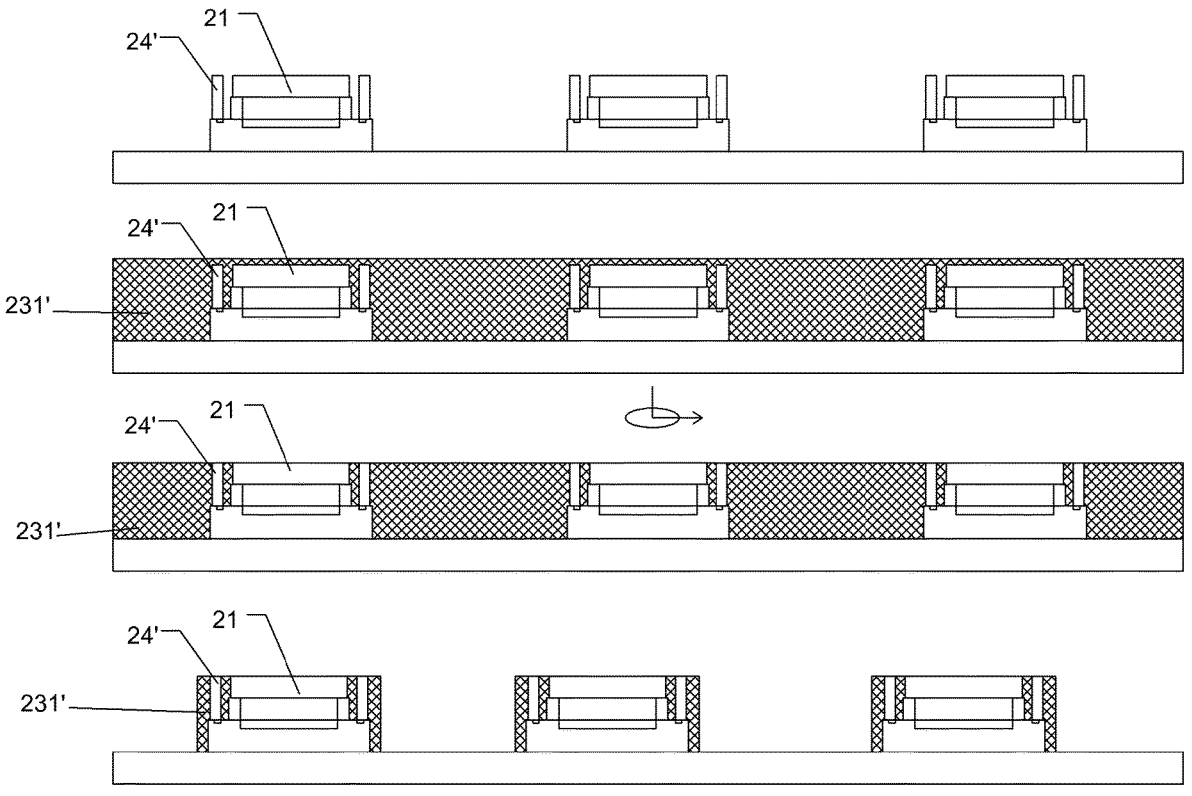
FIG. 12 is a manufacturing process diagram of a photosensitive assembly according to a variant embodiment of the second preferred embodiment.
Figure 13:
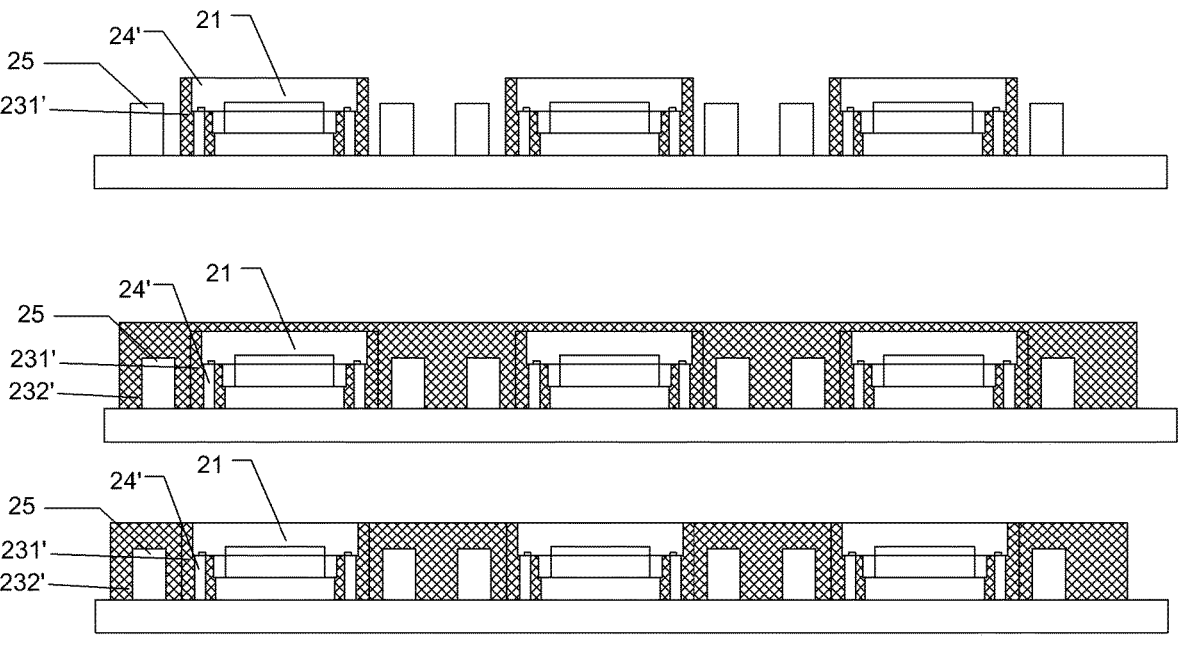
FIG. 13 is a manufacturing process diagram of the photosensitive assembly according to the variant embodiment of the second preferred embodiment.
Figure 17:
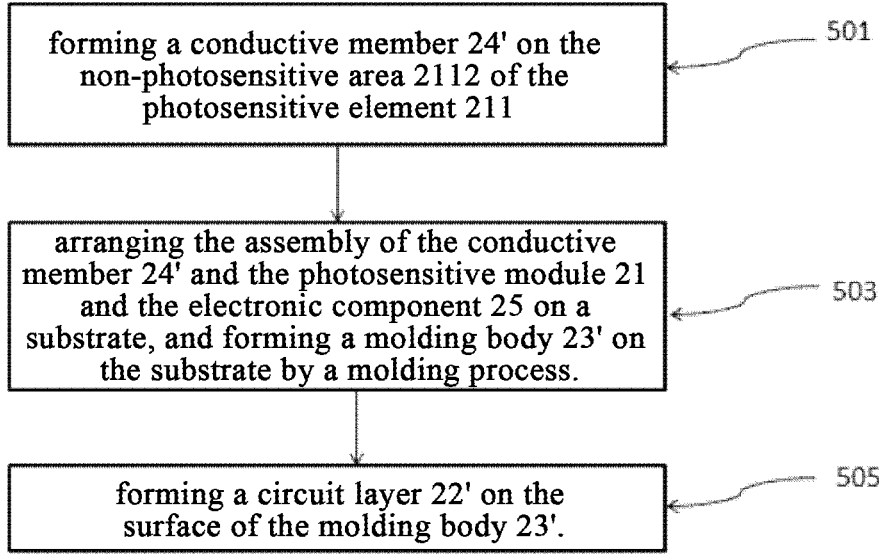
FIG. 17 is a flow chart of preparation of the photosensitive assembly according to the second preferred embodiment.

As shown in FIGS. 12 to 14, a variant embodiment according to the second preferred embodiment of the present invention will be illustrated. In this embodiment, the molding body 23' further includes a first molding body 231' and a second molding body 232'. Specifically, as shown in FIG. 12, the first molding body 231' integrally encapsulates the photosensitive module 21 and the conductive member 24' to form a molding single body. During encapsulating, the photosensitive module 21 is provided forward, that is, the light transmitting element 212 is located above the photosensitive element 211, and the conductive member 24' extends upward from the non-photosensitive region of the photosensitive element 211. By grinding and polishing, free ends of the light transmitting element 212 and the conductive member 24' (an end away from the photosensitive element) are exposed on an upper surface of the first molding body 231'. Further, the second molding body 232' integrally encapsulates the molding single body and the electronic component 25 as shown in FIG. 13 to form a second molding single body 232'. During the secondary encapsulating, the photosensitive module 21 is provided reversely, that is, the light transmitting element 212 is located under the photosensitive element 211, and the electronic component 25 is arranged around the photosensitive module 21 provided in reverse with the electrical connection surface facing downward. By grinding and polishing, when being provided forward, the upper surface of the first molding body 231' and the electrical connection surface of the electronic component 25 are exposed on an upper surface of the second molded body 232'. A thickness of the second molding body 232' can be slightly greater than or equal to a height of the photosensitive module 21 by grinding and polishing, which is beneficial to reduce the thickness of the photosensitive assembly 20 and to facilitate heat dissipation when the camera module is working.

Further, as shown in FIG. 14, the extended wiring layer 22' is formed on the upper surface of the first molding single body 231' and the upper surface of the second molding single body 232'. The extended circuit 221' of the extended wiring layer 22' is electrically connected to the electronic component 25 and the conductive member 24', so as to realize the electrical connection between the electronic component 25 and the photosensitive element 211. At this time, the extended wiring layer 22' defines the light passing hole 222', corresponding to the light transmitting element.

In the second preferred embodiment of the present invention, the camera module further includes a circuit external member, an electrical connection end of the circuit external member is electrically connected to an external electronic device, and the other electrical connection end of the circuit external member is electrically connected to the extended wiring layer 22', so that the camera module cooperates with the electronic device to realize functions such as collection and reproduction of target images, etc.

In another embodiment of the present invention, the photosensitive assembly 20 may further include a second extended wiring layer formed on a bottom side of the molding body 23'. The second extended wiring layer is electrically connected to the extended wiring layer, and the circuit external member is electrically connected to the second extended wiring layer, which can also enable the camera module to cooperate with the electronic device to realize functions such as collection and reproduction of target images, etc.

In the actual production process, in order to improve the production efficiency, the photosensitive module 21 of the present invention can be produced by the jointed panel type preparation method, as shown in FIG. 4. The preparation method of the photosensitive module 21 includes:

Step 301: forming an isolation adhesive layer 213 on a chip wafer by a photolithography process.

The chip wafer includes a plurality of photosensitive elements 211, wherein each photosensitive element 211 has a photosensitive region 2111 and a non-photosensitive region 2112 as shown in FIG. 3. The isolation adhesive layer 213 corresponds to the respective photosensitive regions 2111, and is closed formed in the corresponding non-photosensitive regions 2112.

Specifically, the step 301 may include the following steps to realize the formation of the isolation adhesive layer 213.

(a) coating photosensitive material on a photosensitive surface of the chip wafer;

(b) exposing selective region of the photosensitive material on the chip wafer;

(c) using a developer to remove a part of the photosensitive material, exposing the photosensitive region 2111, and forming the isolation adhesive layer 213.

In the step (a), the photosensitive material may be coated by spin coating, so that the photosensitive material is coated smoothly, and then the flattened isolation adhesive layer 213 is formed.

In the step (b), the photosensitive material to be removed may be exposed, and then the exposed photosensitive material may be removed in the step (c) to form the isolation adhesive layer 213.

Alternatively, the photosensitive material to be left to form the isolation adhesive layer 213 may be exposed, and then the unexposed photosensitive material may be removed in step (c). The process depends on the type of photosensitive material used.

Step 303: covering a light transmitting element 212 on the isolation adhesive layer 213.

The light transmitting element 212 may also be coated with a filter material, such as an anti-reflection film, an infrared cut-off film, or the like. It is worth mentioning that the light transmitting element 212 can be mounted on the isolation adhesive layer 213 in a form of a light transmitting element jointed panel, as shown in FIG. 4., that is, a jointed paneling installation is carried out, that is, once covered, all the isolation adhesive layers 213 of the chip wafer are covered to reduce processing steps and improve efficiency. The area of the light transmitting element jointed panel is not smaller than the chip wafer.

Figure 5:
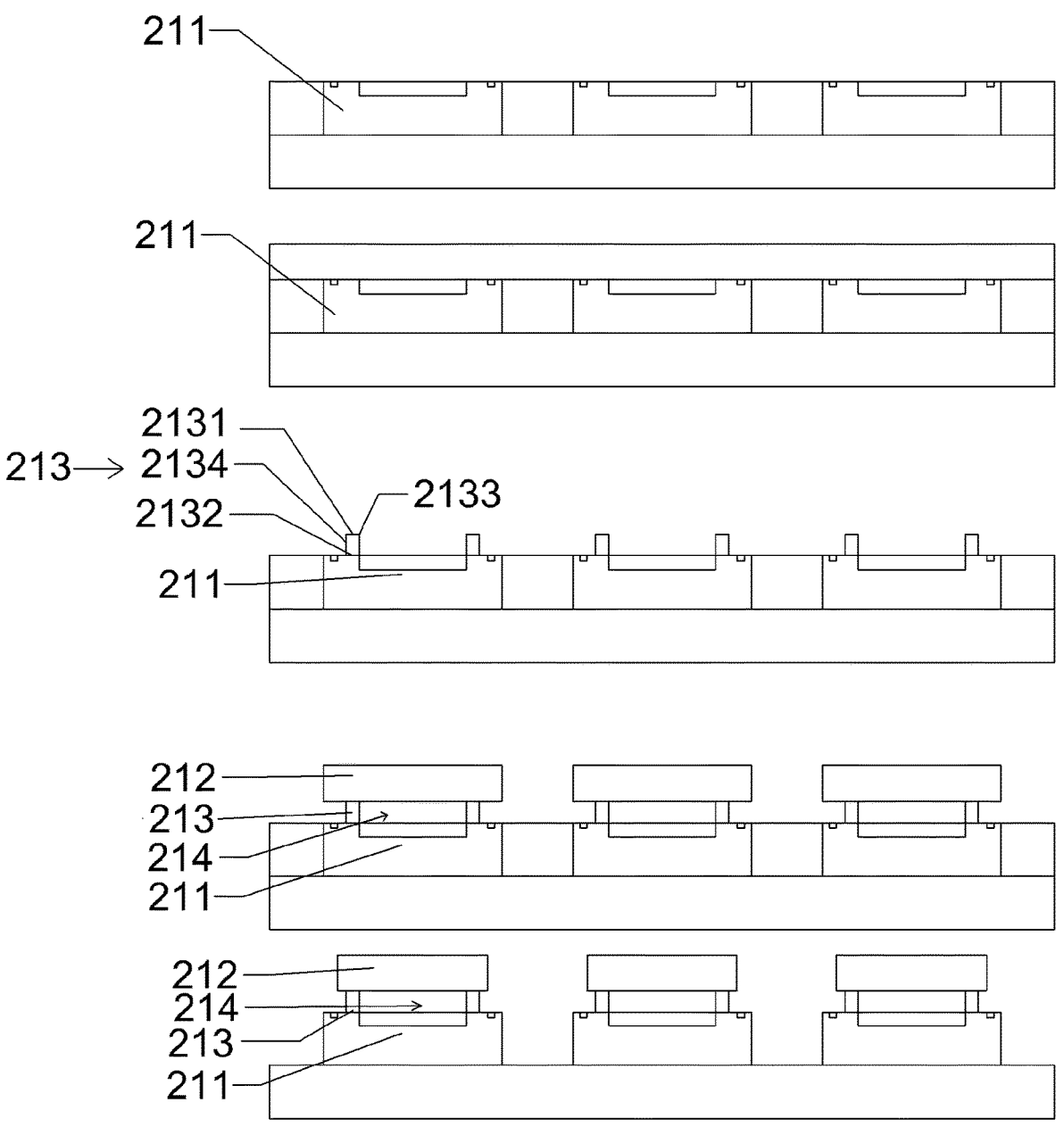
FIG. 5 is a manufacturing process diagram of the photosensitive module according to the first preferred embodiment.

Or in some embodiments of the present invention, the size of the light transmitting element 212 is suitable for covering a single isolation adhesive layer 213, as shown in FIG. 5, that is, multiple light transmitting elements 212 are monolithically covering the corresponding isolation adhesive layer 213 one by one, which can save materials and reduce costs.

In the step 303, the light transmitting element 212 may be fixed to the isolation adhesive layer 213 by glue.

Step 305: cutting the chip wafer formed with the isolation adhesive layer 213.

It can be known that the order of the steps 303 and 305 is not fixed. When the manufacturer wishes to reduce the number of steps, the light transmitting element 212 with an area not less than that of the chip wafer can be used to perform step 305 after one-time coverage. When the size of the light transmitting element 212 is adapted to the single isolation adhesive layer 213, the order of the steps 303 and 305 is not fixed, that is, the manufacturer can cover the light transmitting element 212 before cutting, or the light transmitting element 212 may be covered after the chip wafer is cut.

Further, when the light transmitting element 212 is mounted on the isolation adhesive layer 213 in the form of the light transmitting element jointed panel, at the time of performing the step of cutting the chip wafer formed with the isolation adhesive layer 213, the light transmitting element jointed panel mounted on the isolation adhesive layer 213 will also be cut, and the size of the light transmitting element 212 and the photosensitive element 211 in the monomer obtained at this time are basically the same, in order to facilitate the formation of a conductive member, the light transmitting element 212 may be etched or cut, so that its edge is retracted to the outer edge of the isolation adhesive layer 213. It can be understood that the light transmitting element jointed panel may also be pre-cut, so that the size of the light transmitting element 212 in the monomer obtained after the chip wafer and the light transmitting element jointed panel are cut is smaller than the size of the photosensitive element 211.

Further, in order to facilitate production and avoid scattering of elements after cutting, in step 301, the chip wafer is attached to a carrier. That is to say, each of the photosensitive modules 21 cut in step 305 can be attached to the carrier without being scattered, to avoid damage to the photosensitive region when being scattered, and is also beneficial to mass production.

Compared with the traditional dispensing method, the photolithography method is easier to control, the steps are more concise, the pollution rate to the photosensitive region when the isolation adhesive layer 213 is formed is reduced, and the thickness is reduced and is more even.

It is worth mentioning that, after the photosensitive module 21 is prepared, the photosensitive assembly 20 can be produced by various methods, as described below.

Specifically, as shown in FIG. 6, a manufacturing method of the photosensitive assembly 20 of the present invention will be described. The manufacturing method of the photosensitive assembly 20 includes:

Step 401: electrically connecting a photosensitive module 21 to a circuit layer 22, wherein a backlight surface of the photosensitive module 21 is attached to a circuit layer 22.

As described above, the photosensitive module 21 and the circuit layer 22 may be connected by conductive members 24 such as leads, which will not be repeated here.

Step 403: forming a molding body 23 on a non-photosensitive region of the photosensitive module 21, and encapsulating the photosensitive module 21 in the circuit layer 22.

In an embodiment of the present invention, the molding body has a light passing hole 231, wherein the light passing hole 231 corresponds to the photosensitive region 2111 of the photosensitive element 211, so that light can be sensed by the photosensitive region 2111. Preferably, a diameter of the light passing hole 231 tends to become larger in a direction away from the photosensitive region, on one hand, it is convenient for the molding body to be drawn during the molding process, and on the other hand, it is also convenient for the light to enter and converge.

The step 403 may further include:

(A) grinding a top of the molding body until the light transmitting element 212 of the photosensitive module 21 is exposed.

That is to say, the molding body does not necessarily need to have the light passing hole 231 during the formation process, and it can be grinded so that the light transmitting element 211 is exposed to form the light passing hole 231, the light transmitting element 211 is accommodated in the light passing hole 231.

Wherein, in step 401, a series of electronic components 25 may also be electrically connected to the circuit layer 22, and then the molding body 23 also encapsulates the electronic components 25.

The step 403 may further include:

(B) coating a filter layer to the exposed surface of the light transmitting element 212.

In the grinding process of step (A) in step 403, transmittance of the light transmitting element 212 may be affected, so an additional filter layer is added to ensure the transmittance of the light transmitting element 212.

As shown in FIGS. 9 to 11, another method for manufacturing the photosensitive assembly 20 of the present invention will be described. The method for manufacturing the photosensitive assembly 20' includes:

Step 501: forming a conductive member 24' on the non-photosensitive region 2112 of the photosensitive element 211, and the conductive member 24' is electrically connected to the electrical connector 2113 of the photosensitive element 211.

Step 503: arranging an assembly of the conductive member 24' and the photosensitive module 21 and the electronic component 25 on a substrate, and forming a molding body 23' on the substrate by a molding process, Step 505: forming a circuit layer 22' on the surface of the molding body 23'.

Wherein, the molding body 23' integrally encapsulates the photosensitive module 21, the conductive member 24' and the electronic component 25.

In this embodiment, the circuit layer 22' is implemented as an extended wiring layer 22', and the extended wiring layer 22' is formed by a rewiring process, which will not be repeated here. The extended wiring layer 22' electrically connects the conductive member 24' and the photosensitive element 211.

In one embodiment of the present invention, the step 503 may include: grinding and polishing the molding body 23' so that the electrical connectors of the light transmitting element 212, the conductive member 24' and the electronic component 25 can be exposed with respect to the molding body 23'. That is to say, in this embodiment, the electronic component 25 is arranged with its electrical connection surface facing away from the substrate.

In another embodiment of the present invention, the step 503 may further include:

(I) forming a first molding body 231' that integrally encapsulates the photosensitive module 21 and the conductive member 24' through a molding process, thereby forming a molding single body.

(II) grinding and polishing the first molding body 231' so that the light transmitting element 212 and the conductive member 24' are exposed on the surface of the first molding body 231'.

(III) turning over and placing the obtained molding single body on a substrate at intervals. In other words, the photosensitive element 211 in the molding single body faces the substrate, and at the same time, the electronic component 25 is placed downward at a preset position on the substrate, that is, the electrical connection surface of the component 25 is in contact with the substrate.

(IV) forming a second molding body 232' that integrally encapsulates the molding monomer and the electronic component 25 through a molding process, and grinding and polishing the second molding body 232' to form a second molding single body.

(V) turning over the second molding single body, and then, performing the step 505.

Further, the step 503 may further include the step of applying a filter layer on the surface of the light transmitting element 212 exposed with respect to the molding body 23', the filter layer may be a light filter coating that is similar to an anti-reflection film, an infrared cut-off film, etc.

Those skilled in the art should understand that the embodiments of the present invention shown in the above description and drawings are only examples and do not limit the present invention. The object of the present invention has been completely and effectively achieved. The functions and structural principles of the present invention have been shown and described in the embodiments.

Without departing from the principles, the embodiments of the present invention may have any variations or modifications.

The invention claimed is:

1. A method for manufacturing a photosensitive assembly, including the steps of:

(i) forming a plurality of isolation adhesive layers at a preset position of a chip wafer by a photolithography process, wherein the chip wafer has a plurality of photosensitive elements arranged in an array, and each photosensitive element is provided with the isolation adhesive layer in its non-photosensitive region;

(ii) covering at least one light transmitting element on at least one of the isolation adhesive layers;

(iii) cutting the chip wafer to form a plurality of the photosensitive modules;

(iv) conductively mounting at least one conductive member on the non-photosensitive region of the photosensitive element;

(v) arranging the photosensitive modules on a substrate in an array;

(vi) forming a molding body on the substrate through a molding process to encapsulate the photosensitive module and the conductive member;

(vii) mounting a circuit layer on the surface of the molding body on a light incident side, wherein the circuit layer is conductively connected to the conductive member, wherein the circuit layer has a plurality of light passing holes corresponding to the photosensitive paths of the photosensitive element, to form a photosensitive assembly jointed panel; and (viii) cutting the photosensitive assembly jointed panel to form a plurality of photosensitive assemblies.

2. The manufacturing method according to claim 1, wherein the step (vii) further includes the steps of:

(vii.1) forming an extended wiring layer by a rewiring process on the surface of the molding body on the light incident side, wherein the extended wiring layer is conductively connected to the conductive member, wherein the extended wiring layer has a plurality of light passing holes corresponding to the photosensitive paths of the photosensitive element, to form the photosensitive assembly jointed panel.

3. The manufacturing method according to claim 1, wherein the step (vi) further includes the step of:

(vi.1) exposing the conductive member and the light transmitting element with respect to the molding body.

4. The manufacturing method according to claim 1, wherein the step (v) further includes the step of: providing at least one electronic component on the substrate, wherein an electrical connection surface of the electronic component is away from the substrate; in the step (vi), the molding body encapsulates the electronic component, the photosensitive module, and the conductive member; and in the step (vii), the circuit layer is electrically connected with the electrical connection surface of the electronic component.

5. The manufacturing method according to claim 1, wherein the step (vi) further includes the step of:

(vi.2) forming a first molding body integrally encapsulating the photosensitive module and the conductive member through a molding process to form a molding single body;

(vi.3) exposing the light transmitting element and the conductive member with respect to the first molding body;

(vi.4) turning over the molding single body and arranging in an array on the substrate so that the photosensitive surface of the photosensitive element faces the substrate;

(vi.5) providing at least one electronic component on the substrate, wherein the electrical connection surface of the electronic component contacts the substrate; and (vi.6) integrally encapsulating the molding single body and the electronic component through a molding process to form a second molding body.

6. The manufacturing method according to claim 1, wherein the step (vii) further includes the steps of:

(vii.2) turning over the second molding single body so that the non-photosensitive surface of the photosensitive element faces the substrate, and the electrical connection surface of the electronic component is away from the substrate;

(vii.3) electrically connecting and mounting the circuit layer and the conductive member, the electrical connection surfaces of the electronic component, and the circuit layer has a plurality of light passing holes corresponding to the photosensitive paths of the photosensitive element to form the photosensitive assembly jointed panel.

* * * * *